(12) United States Patent
Koga

(10) Patent No.: US 11,742,369 B2
(45) Date of Patent: Aug. 29, 2023

(54) SOLID-STATE IMAGE SENSING DEVICE WITH A CAPACITANCE SWITCHING TRANSISTOR OVERLAPPING A PHOTODIODE AND ELECTRONIC DEVICE HAVING THE SAME

(71) Applicant: SONY SEMICONDUCTOR SOLUTIONS CORPORATION, Kanagawa (JP)

(72) Inventor: Fumihiko Koga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/541,509

(22) Filed: Dec. 3, 2021

(65) Prior Publication Data

US 2022/0093659 A1  Mar. 24, 2022

Related U.S. Application Data

(60) Continuation of application No. 16/789,960, filed on Feb. 13, 2020, now Pat. No. 11,211,411, which is a
(Continued)

(30) Foreign Application Priority Data

Jan. 29, 2015  (JP) .................................. 2015-015538

(51) Int. Cl.
*H01L 27/146* (2006.01)
*H04N 25/59* (2023.01)
(Continued)

(52) U.S. Cl.
CPC ...... *H01L 27/14612* (2013.01); *H01L 27/146* (2013.01); *H01L 27/1464* (2013.01);
(Continued)

(58) Field of Classification Search
CPC .................... H01L 27/14665–1467; H01L 27/14609–14616;
(Continued)

(56) References Cited

U.S. PATENT DOCUMENTS 7,075,049 B2 * 7/2006 Rhodes ................ H04N 25/587
250/214 AG
9,905,615 B2 2/2018 Lee et al.
(Continued)

FOREIGN PATENT DOCUMENTS

JP  2007-329161  12/2007
JP  2011-204797  10/2011
(Continued)

OTHER PUBLICATIONS

International Search Report and Written Opinion for International (PCT) Patent Application No. PCT/JP2016/051075, dated Apr. 12, 2016, 6 pages.
(Continued)

*Primary Examiner* — Younes Boulghassoul
(74) *Attorney, Agent, or Firm* — SHERIDAN ROSS P.C.

(57) ABSTRACT

The present technology relates to a solid-state image sensing device capable of restricting a deterioration in photoelectric conversion characteristic of a photoelectric conversion unit, and an electronic device. A solid-state image sensing device includes: a photoelectric conversion unit formed outside a semiconductor substrate; a charge holding unit for holding signal charges generated by the photoelectric conversion unit; a reset transistor for resetting the potential of the charge holding unit; a capacitance switching transistor connected to the charge holding unit and directed for switching the capacitance of the charge holding unit; and an additional capacitance device connected to the capacitance switching
(Continued)

transistor. The present technology is applicable to solid-state image sensing devices and the like, for example.

20 Claims, 22 Drawing Sheets

Related U.S. Application Data division of application No. 15/544,645, filed as application No. PCT/JP2016/051075 on Jan. 15, 2016, now abandoned.

(51) Int. Cl.
| | | |
|---|---|---|
| H04N 25/76 | (2023.01) | |
| H04N 25/77 | (2023.01) | |
| H04N 25/771 | (2023.01) | |
| H04N 23/62 | (2023.01) | |
| H04N 25/50 | (2023.01) | |
| H10K 39/32 | (2023.01) | |

(52) U.S. Cl.
CPC .. *H01L 27/14641* (2013.01); *H01L 27/14647* (2013.01); *H01L 27/14667* (2013.01); *H04N 25/59* (2023.01); *H04N 25/76* (2023.01); *H04N 25/77* (2023.01); *H04N 25/771* (2023.01); *H04N 23/62* (2023.01); *H04N 25/50* (2023.01); *H10K 39/32* (2023.02)

(58) Field of Classification Search
CPC ....... H01L 27/14645–14647; H01L 27/14656; H01L 27/14674; H10K 39/32; H04N 25/59; H04N 25/571; H04N 25/771
See application file for complete search history.

(56) References Cited

U.S. PATENT DOCUMENTS

| | | | |
|---|---|---|---|
| 11,211,411 B2 | 12/2021 | Koga | |
| 2007/0035649 A1* | 2/2007 | McKee | H04N 25/59 348/E3.018 |
| 2007/0153109 A1* | 7/2007 | Lule | H04N 25/42 348/E3.019 |
| 2007/0170478 A1 | 7/2007 | Araki | |
| 2007/0285538 A1 | 12/2007 | Suzuki | |
| 2007/0290238 A1* | 12/2007 | Adachi | H04N 25/59 348/E3.018 |
| 2009/0045319 A1* | 2/2009 | Sugawa | H04N 25/771 250/208.1 |
| 2010/0128156 A1* | 5/2010 | Tanaka | H04N 25/771 348/308 |
| 2012/0132787 A1* | 5/2012 | Mabuchi | H04N 25/65 257/E31.124 |
| 2012/0154656 A1* | 6/2012 | Oike | H01L 27/14656 348/308 |
| 2012/0193689 A1 | 8/2012 | Park et al. | |
| 2012/0200752 A1 | 8/2012 | Matsunaga | |
| 2012/0256077 A1* | 10/2012 | Yen | H01L 27/14643 250/208.1 |
| 2013/0001403 A1* | 1/2013 | Yamakawa | H01L 27/1464 257/E31.093 |
| 2013/0099093 A1* | 4/2013 | Kawanabe | H01L 27/14609 250/206 |
| 2014/0084143 A1 | 3/2014 | Sakano et al. | |
| 2014/0151531 A1* | 6/2014 | Yamashita | H01L 27/14643 257/435 |
| 2014/0209876 A1 | 7/2014 | Yamaguchi et al. | |
| 2015/0021459 A1* | 1/2015 | Roy | H04N 25/75 257/292 |
| 2015/0091123 A1 | 4/2015 | Chang et al. | |
| 2015/0194469 A1 | 7/2015 | Joei | |
| 2016/0112665 A1* | 4/2016 | Meynants | H04N 23/667 250/208.1 |
| 2016/0133865 A1 | 5/2016 | Yamaguchi | |
| 2016/0190188 A1* | 6/2016 | Murakami | H01L 27/14665 250/214 A |
| 2017/0019618 A1 | 1/2017 | Koga | |
| 2017/0048471 A1* | 2/2017 | Anaxagoras | H04N 25/75 |
| 2017/0148838 A1 | 5/2017 | Togashi | |
| 2017/0229503 A1* | 8/2017 | Suzuki | H01L 27/1462 |
| 2017/0243912 A1 | 8/2017 | Kaneda | |
| 2017/0257587 A1 | 9/2017 | Hatano et al. | |
| 2017/0324916 A1* | 11/2017 | Sugawa | H04N 25/75 |
| 2017/0373107 A1 | 12/2017 | Koga | |
| 2018/0342558 A1 | 11/2018 | Hirata et al. | |
| 2019/0166319 A1* | 5/2019 | Sato | H01L 27/14612 |

FOREIGN PATENT DOCUMENTS

| | | |
|---|---|---|
| JP | 2013-033896 | 2/2013 |
| JP | 2013-192058 | 9/2013 |
| KR | 10-1067303 | 9/2011 |
| WO | WO 2007/083704 | 7/2007 |

OTHER PUBLICATIONS

Extended European Search Report for European Patent Application No. 16743125.3, dated May 29, 2018, 6 pages.
Official Action (no English translation available) for Japanese Patent Application No. 2016-571929, dated Jan. 7, 2020, 7 pages.
Official Action for U.S. Appl. No. 15/544,645, dated Jul. 6, 2018, 14 pages.
Official Action for U.S. Appl. No. 15/544,645, dated Mar. 1, 2019, 14 pages.
Official Action for U.S. Appl. No. 15/544,645, dated Nov. 13, 2019, 17 pages.
Official Action for U.S. Appl. No. 16/789,960, dated Jan. 19, 2021, 7 pages. Restriction Requirement.
Official Action for U.S. Appl. No. 16/789,960, dated Mar. 29, 2021, 19 pages.
Notice of Allowance for U.S. Appl. No. 16/789,960, dated Aug. 27, 2021, 14 pages.
Notice of Allowance (with English translation) for Korea Patent Application No. 10-2017-7017802, dated Jun. 6, 2023, 5 pages.

\* cited by examiner

SOLID-STATE IMAGE SENSING DEVICE WITH A CAPACITANCE SWITCHING TRANSISTOR OVERLAPPING A PHOTODIODE AND ELECTRONIC DEVICE HAVING THE SAME

CROSS REFERENCE TO RELATED APPLICATIONS

This application is a continuation of Ser. No. 16/789,960, filed Feb. 13, 2020, which is a divisional of U.S. patent application Ser. No. 15/544,645, filed Jul. 19, 2017, now abandoned, which is a national stage application under 35 U.S.C. 371 and claims the benefit of PCT Application No. PCT/JP2016/051075 having an international filing date of 15 Jan. 2016, which designated the United States, which PCT application claimed the benefit of Japanese Patent Application No. 2015-015538 filed 29 Jan. 2015, the disclosures of which are incorporated herein by reference in their entirety.

TECHNICAL FIELD

The present technology relates to a solid-state image sensing device and an electronic device, and particularly to a solid-state image sensing device capable of restricting a deterioration in photoelectric conversion characteristic of a photoelectric conversion unit, and an electronic device.

BACKGROUND ART

In recent years, there has been proposed a configuration of arranging a photoelectric conversion unit outside a semiconductor substrate as a technique for non-continuously changing the characteristic of an image sensor. For example, Patent Documents 1 to 3 disclose a structure of arranging a photoelectric conversion unit on top of a semiconductor substrate and accumulating a photoelectric conversion signal in the semiconductor substrate. The structure enables the photoelectric conversion characteristic determined by a conventional semiconductor substrate material to be largely changed, and a sensor technique to be applied in the fields which have been conventionally difficult to realize by a silicon (Si) image sensor.

Further, in a pixel arrangement in which Red, Blue, and Green color filters are arranged in a plane manner, which is widely used in image sensors at present, color separation is performed by absorbing a light with a specific wavelength in units of pixel. Therefore, the lights with the wavelengths of Blue and Green are absorbed and lost in the color filter for Red pixels, for example.

As a solution thereof, there is proposed in Patent Document 1 a stacked-type solid-state image sensing device in which the photoelectric conversion regions for photoelectrically converting the Red, Blue, and Green lights are stacked in the same pixel space, for example. The structure enables a deterioration in sensitivity due to light absorption by the color filter to be restricted. Further, the structure does not need an interpolation processing, and an effect that a false color does not occur can be expected.

The structure of arranging a photoelectric conversion unit outside a semiconductor substrate needs to electrically connect the photoelectric conversion unit and the semiconductor substrate. A metal is used for connecting the photoelectric conversion unit and the semiconductor substrate, and thus the signal charges caused in the photoelectric conversion unit cannot be perfectly transferred to a charge holding unit via a transfer gate. Therefore, the structure generally employs a configuration of directly connecting the photoelectric conversion unit and the charge holding unit as disclosed in Patent Document 1.

With the photoelectric conversion unit in the structure, however, photoelectric conversion and sensitivity of the photoelectric conversion unit are deteriorated. In order to improve the deterioration in sensitivity of the photoelectric conversion unit, a solution of increasing the capacitance of the charge holding unit and decreasing a voltage variation relative to signal charges is useful. However, when the capacitance of the charge holding unit is increased, the signal amplification rate of the charge holding unit is decreased, and thus the S/N ratio of the solid-state image sensing device is lowered.

Thus, Patent Document 4 proposes a method for controlling the capacitance of a charge holding unit depending on the amount of signal charges. Specifically, the capacitance of the charge holding unit is controlled such that at low illuminance at which a high S/N ratio is required, the capacitance of the signal holding unit is decreased, and at high illuminance at which a large amount of signal charges need to be held, the capacitance of the charge holding unit is increased by use of a capacitance addition unit.

With the configuration, however, the capacitance addition unit needs to be depleted in order to decrease the capacitance of the charge holding unit at low illuminance at which a high S/N ratio is required. Consequently, a depleted region is connected to the charge holding unit, and the leak characteristic is deteriorated at low illuminance.

Further, in Patent Document 5, a transistor (Tr) for capacitance addition is arranged between a floating diffusion (FD) unit and a reset Tr thereby to control the signal amplification rate.

CITATION LIST

Patent Document

Patent Document 1: Japanese Patent Application Laid-Open No. 2007-329161
Patent Document 2: Japanese Patent Application Laid-Open No. 2010-278086
Patent Document 3: Japanese Patent Application Laid-Open No. 2011-138927
Patent Document 4: Japanese Patent Application Laid-Open No. 2013-89869
Patent Document 5: Japanese Patent Application Laid-Open No. 2010-124418

SUMMARY OF THE INVENTION

Problems to be Solved by the Invention

With the configuration in Patent Document 5, however, a read Tr is arranged between a photoelectric conversion unit and a signal amplification unit, and thus the capacitance of the site between the photoelectric conversion unit and the read Tr cannot be controlled. Thus, the voltage of the photoelectric conversion unit varies depending on the amount of signal charges, and thus the photoelectric conversion efficiency also varies.

The present technology has been made in terms of the situations, and is therefore directed for restricting a deterioration in photoelectric conversion characteristic of a photoelectric conversion unit.

Solutions to Problems

A solid-state image sensing device of a first aspect of the present technology includes: a photoelectric conversion unit formed outside a semiconductor substrate; a charge holding unit for holding signal charges generated by the photoelectric conversion unit; a reset transistor for resetting the potential of the charge holding unit; a capacitance switching transistor connected to the charge holding unit and directed for switching the capacitance of the charge holding unit; and an additional capacitance device connected to the capacitance switching transistor.

An electronic device of a second aspect of the present technology includes a solid-state image sensing device, the solid-state image sensing device including a pixel having: a photoelectric conversion unit formed outside a semiconductor substrate; a charge holding unit for holding signal charges generated by the photoelectric conversion unit; a reset transistor for resetting the potential of the charge holding unit; a capacitance switching transistor connected to the charge holding unit and directed for switching the capacitance of the charge holding unit; and an additional capacitance device connected to the capacitance switching transistor.

According to the first and second aspects of the present technology, the signal charges generated in the photoelectric conversion unit formed outside the semiconductor substrate are held in the charge holding unit, and the potential of the charge holding unit is reset by the reset transistor. The capacitance of the charge holding unit is switched by the capacitance switching transistor connected to the charge holding unit, and the additional capacitance device is connected to the capacitance switching transistor.

The solid-state image sensing device and the electronic device may be independent devices, and may be the modules incorporated in other device.

Effects of the Invention

According to the first and second aspects of the present technology, it is possible to restrict a deterioration in photoelectric conversion characteristic of the photoelectric conversion unit.

Note that the effects described herein are not limited, and any of the effects described in the present technology may be obtained.

MODE FOR CARRYING OUT THE TECHNOLOGY

Modes for carrying out the present technology (which will be called embodiments below) will be described below. Note that the description will be made in the following order.

1. Description of basic pixel
2. First embodiment (exemplary configuration in which reset transistor and capacitance switching transistor are connected in parallel)
3. Second embodiment (exemplary configuration in which reset transistor and capacitance switching transistor are connected in series)
4. Third embodiment (exemplary configuration in which signal charges are holes)
5. Fourth embodiment (exemplary configuration in which gate part of additional capacitance device is connected to charge holding unit)
6. Fifth embodiment (exemplary configuration with photoelectric conversion film and photodiodes)
7. Exemplary schematic configuration of solid-state image sensing device
8. Exemplary applications to electronic devices

1. Description of Basic Pixel

A pixel of a solid-state image sensing device, which is a basic configuration to which the present technology is applied, (which will be called basic pixel below) will be first described in order to facilitate understanding of the present technology.

Equivalent Circuit of Basic Pixel

Figure 1:
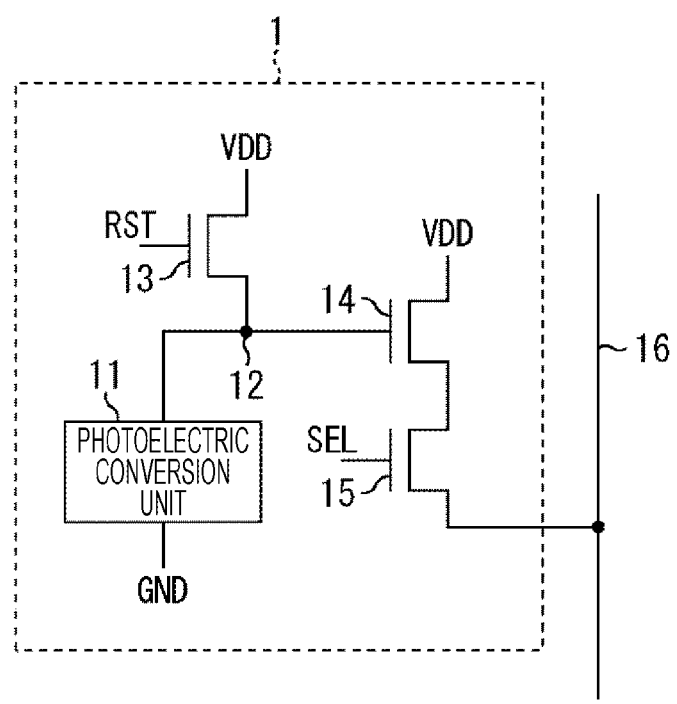
FIG. 1 is a diagram illustrating an equivalent circuit of a basic pixel.

FIG. 1 illustrates an equivalent circuit of a basic pixel.

A basic pixel 1 illustrated in FIG. 1 has a photoelectric conversion unit 11, a charge holding unit 12, a reset transistor 13, an amplification transistor (output transistor) 14, and a select transistor 15.

The photoelectric conversion unit 11 generates and accumulates charges (signal charges) depending on the amount of received lights. One end of the photoelectric conversion unit 11 is grounded, and the other end thereof is connected to the charge holding unit 12, a source of the reset transistor 13, and a gate of the amplification transistor 14. In the configuration of FIG. 1, the signal charges are electrons.

Figure 2:
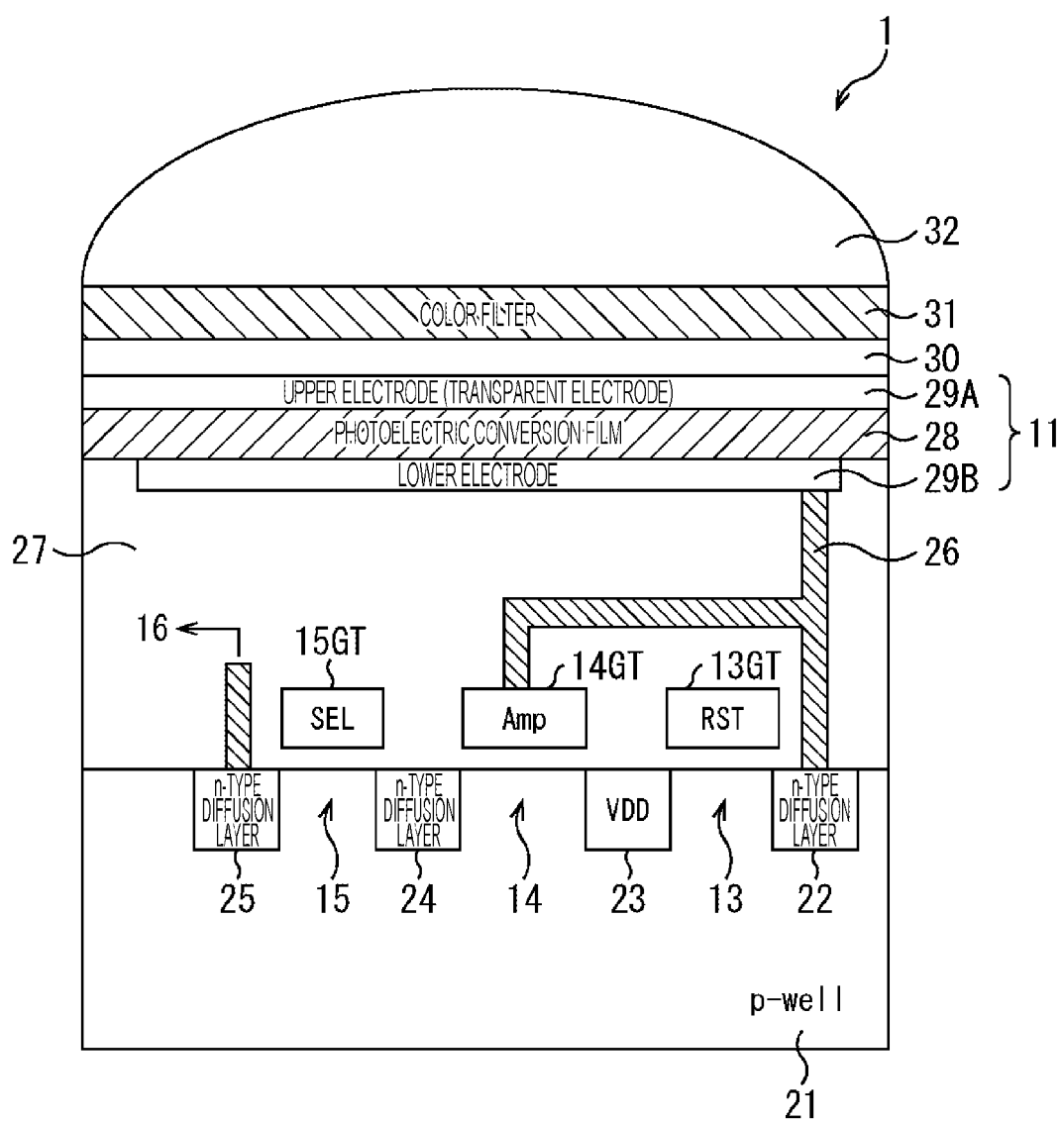
FIG. 2 is a diagram illustrating a cross-section structure of the basic pixel.

The charge holding unit 12 holds the charges read from the photoelectric conversion unit 11. As illustrated in FIG. 2 below, the charge holding unit 12 is connected to one end of the photoelectric conversion unit 11, the source of the reset transistor 13, and the gate of the amplification transistor 14, and thus the charges are actually held in all of them.

When the reset transistor 13 is turned on by a reset signal RST supplied to a gate of the reset transistor 13, the charges accumulated in the charge holding unit 12 are discharged to a drain of the reset transistor 13 (power supply voltage VDD) and the reset transistor 13 resets the potential of the charge holding unit 12.

The gate of the amplification transistor 14 is connected to the charge holding unit 12, a drain thereof is connected to the power supply voltage VDD, and a source thereof is connected to a drain of the select transistor 15. The amplification transistor 14 outputs a pixel signal depending on the potential of the charge holding unit 12. That is, the amplification transistor 14 configures a source follower circuit with a load MOS (not illustrated) as constant current source connected via a sequence signal line 16 for transmitting a pixel signal output from the basic pixel 1, and a pixel signal at a level depending on the charges accumulated in the charge holding unit 12 is output to an AD conversion unit (not illustrated) from the amplification transistor 14 via the select transistor 15. The load MOS is provided inside the AD conversion unit provided in units of column for a plurality of two-dimensionally arranged basic pixels 1, for example.

The drain of the select transistor 15 is connected to the source of the amplification transistor 14, and a source thereof is connected to the sequence signal line 16 for transmitting a pixel signal of each basic pixel 1 arranged in the column direction (the vertical direction). When the basic pixel 1 is selected by a select signal SEL supplied to a gate of the select transistor 15, the select transistor 15 is turned on thereby to output the pixel signal of the basic pixel 1 to the AD conversion unit via the sequence signal line 16.

Cross-Section Structure of Basis Pixel

FIG. 2 is a diagram illustrating a cross-section structure of the basic pixel.

The reset transistor 13, the amplification transistor 14, and the select transistor 15 are formed on one interface (upper surface in the Figure) of a P-type semiconductor substrate (P-Well) 21 in the basic pixel 1.

Specifically, the reset transistor 13 is configured of a gate part 13GT on the P-type semiconductor substrate 21, and n-type diffusion layers 22 and 23 in the P-type semiconductor substrate 21, the amplification transistor 14 is configured of a gate part 14GT on the P-type semiconductor substrate 21, and n-type diffusion layers 23 and 24 in the P-type semiconductor substrate 21, and the select transistor 15 is configured of a gate part 15GT on the P-type semiconductor substrate 21, and n-type diffusion layers 24 and 25 in the P-type semiconductor substrate 21. The gate parts 13GT, 14GT, and 15GT are made of polysilicon, for example.

The n-type diffusion layer 22 serves as the source of the reset transistor 13 and the charge holding unit 12, and is connected to a lower electrode 29B in the photoelectric conversion unit 11 described later and the gate part 14GT of the amplification transistor 14 via a metal wiring 26. Thus, the lower electrode 29B in the photoelectric conversion unit 11, the n-type diffusion layer 22, and the gate part 14GT of the amplification transistor 14, which are connected via the metal wiring 26, collectively serve as the charge holding unit 12 holding the charges therein. The metal wiring 26 is made of tungsten (W), aluminum (Al), copper (Cu), or the like, for example.

The n-type diffusion layer 23 serves as the drain of the reset transistor 13 and the drain of the amplification transistor 14, and the n-type diffusion layer 23 is applied with the power supply voltage VDD.

The n-type diffusion layer 24 serves as the source of the amplification transistor 14 and the drain of the select transistor 15. The n-type diffusion layer 25 functions as the source of the select transistor 15 and is connected to the sequence signal line 16.

The photoelectric conversion unit 11 is formed via an insulative layer 27 over the respective pixel transistors (the reset transistor 13, the amplification transistor 14, and the select transistor 15) in the P-type semiconductor substrate 21.

The photoelectric conversion unit 11 is formed such that a photoelectric conversion film 28 is sandwiched between an upper electrode 29A and the lower electrode 29B. The photoelectric conversion film 28 may employ an organic photoelectric conversion film, CIGS (Cu, In, Ga, Se compounds), CIS (Cu, In, Se compounds), chalcopyrite semiconductor, compound semiconductor such as GaAs, or the like. The upper electrode 29A is made of a transparent electrode film such as indium tin oxide (ITO) film or indium zinc oxide film. The lower electrode 29B is made of an electrode film of tungsten (W), aluminum (Al), copper (Cu), or the like. The upper electrode 29A is commonly formed for all the pixels, while the lower electrode 29B is formed in units of pixel. The upper electrode 29A is connected to the ground (GND).

A color filter 31 and an on-chip lens 32 are formed over the upper electrode 29A via a protective film (insulative film) 30. The color filter 31 is such that Red, Green and Blue are arranged in the Bayer layout in units of pixel, for example. Thus, the photoelectric conversion film 28 photoelectrically converts any light of Red, Green or Blue transmitted through the color filter 31.

The basic pixel 1 is formed in the above cross-section structure.

Problems of Basic Pixel

Problems caused in the basic pixel 1 will be described with reference to FIG. 3 and FIG. 4.

Figure 3:
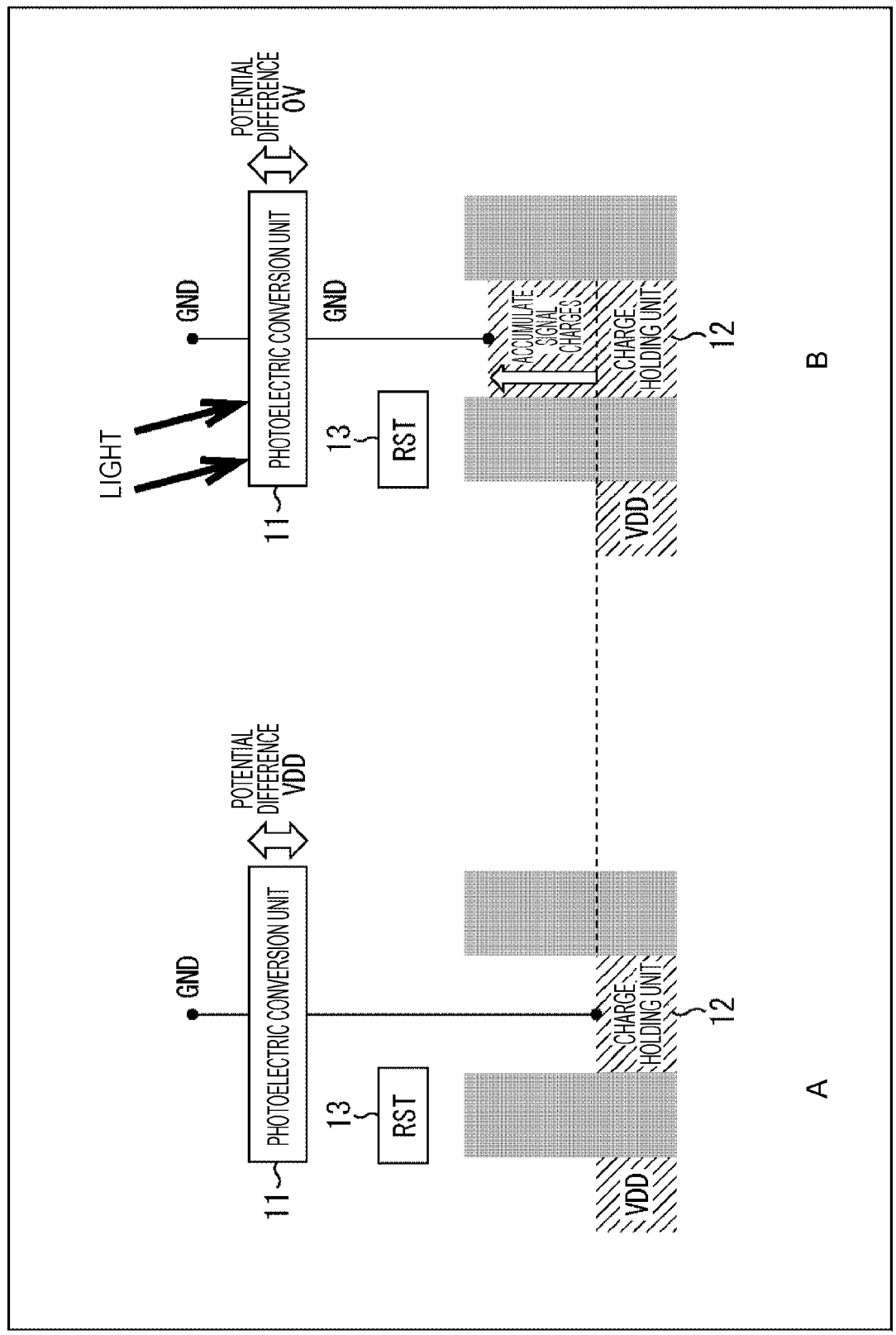
FIG. 3 is a diagram for explaining problems caused in the basic pixel.

FIG. 3 is a diagram illustrating the operations of the photoelectric conversion unit 11, the charge holding unit 12, and the reset transistor 13 which are directed for holding the charges in the basic pixel 1 by comparing a flow of current (electrons) and a gate of the transistor to a water flow and a water gate, respectively. In FIG. 3, on/off of the gate of the transistor is indicated by top/bottom of the gray water gate, respectively. The gray water gate moves upward or downward so that the hatched (shaded) water flow (current) is controlled. In the Figure, a height in the longitudinal direction indicates voltage, and as the gray water gate or the hatched part is lower, the voltage is higher.

A of FIG. 3 illustrates a state before the photoelectric conversion unit 11 receives a light.

Before the light reception, the reset transistor 13 is turned on so that the potential of the charge holding unit 12 is reset at VDD. Then, the upper electrode 29A in the photoelectric conversion unit 11 is connected to the ground (GND), and thus a potential difference between the upper electrode 29A and the lower electrode 29B in the photoelectric conversion unit 11 is VDD.

When signal charges are generated and accumulated by photoelectric conversion during the light reception, the voltage of the charge holding unit 12 holding a photoelectric conversion signal changes and the voltage to be applied to the photoelectric conversion unit 11 decreases as illustrated in B of FIG. 3. Consequently, a sufficient voltage for taking out the generated signal is not applied to the photoelectric conversion film 28, and the sensitivity of the photoelectric conversion unit 11 is deteriorated.

In order to improve the problem of the deterioration in sensitivity, a solution of increasing the capacitance of the charge holding unit 12 and decreasing a variation in voltage relative to the signal charges is useful. However, when the capacitance of the charge holding unit 12 is increased, the signal amplification rate of the charge holding unit 12 lowers, and thus the S/N ratio of the solid-state image sensing device is lowered.

Thus, as disclosed in Patent Document 4 described in BACKGROUND ART, there is a method for controlling the capacitance of the charge holding unit 12 depending on the amount of signal charges as a method for preventing a reduction in the S/N ratio of the solid-state image sensing device. That is, the method is directed for controlling the capacitance of the charge holding unit 12 such that the capacitance of the charge holding unit 12 is decreased at low illuminance at which a high S/N ratio is required, and the capacitance of the charge holding unit 12 is increased at high illuminance at which a large amount of signal charges need to be held. The capacitance control is enabled by providing the charge holding unit 12 with a capacitance addition device, for example. With the configuration, however, the capacitance addition unit needs to be depleted in order to decrease the capacitance of the charge holding unit 12 at low illuminance at which a high S/N ratio is required. There is consequently caused a problem that a depleted region is connected to the charge holding unit 12 and the leak characteristic is deteriorated at low illuminance.

Further, for example, according to Patent Document 5 described in BACKGROUND ART, a capacitance addition transistor (Tr) is arranged between a FD unit and a reset Tr thereby to control the signal amplification rate.

Figure 4:
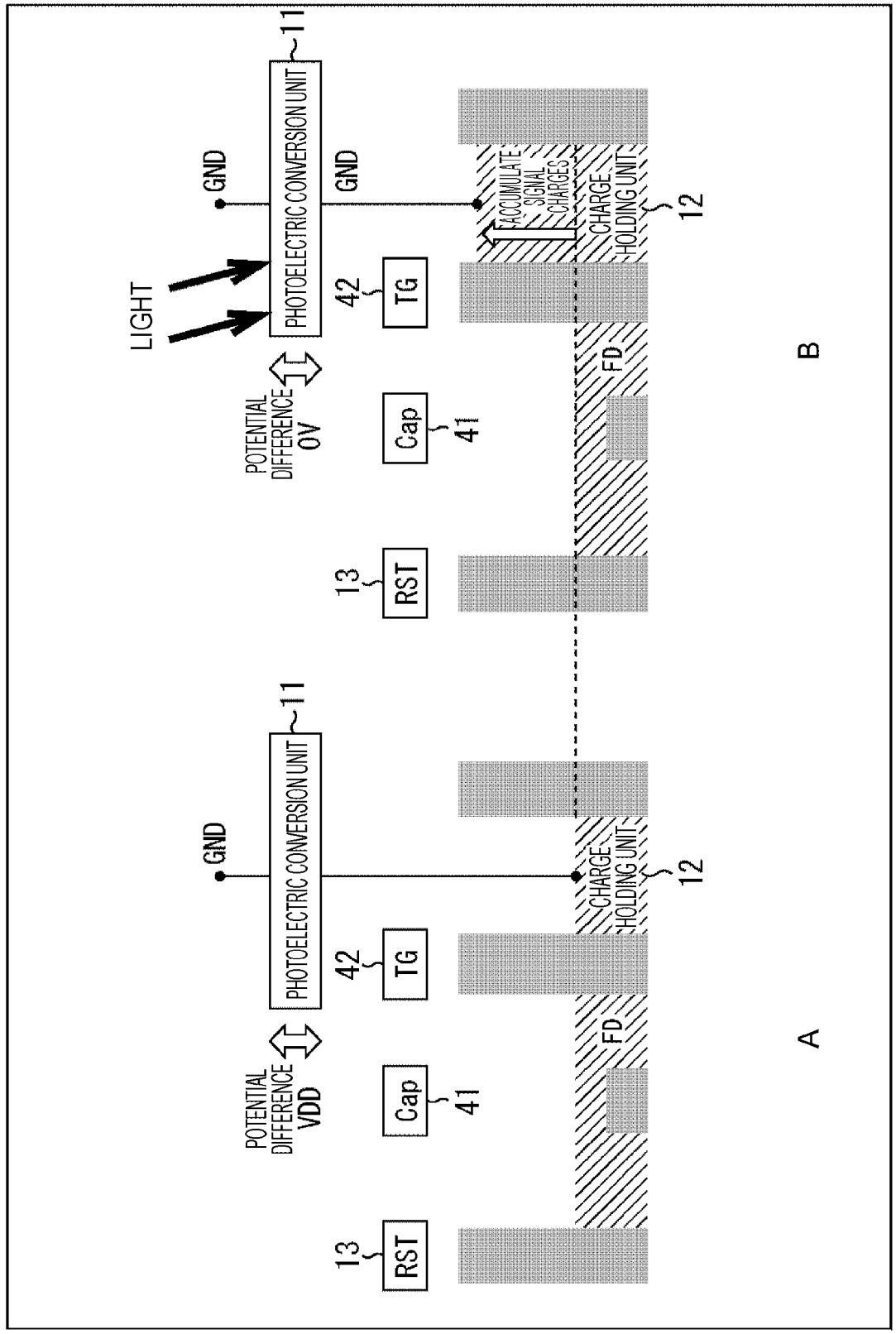
FIG. 4 is a diagram for explaining problems caused in the basic pixel.

FIG. 4 is a diagram illustrating a configuration of a charge holding part in a pixel disclosed in Patent Document 5 like a water flow similarly as in FIG. 3).

With the configuration of the pixel disclosed in Patent Document 5, a read Tr (TG) 42 is arranged between the photoelectric conversion unit 11 and a signal amplification unit 41 as illustrated in A of FIG. 4, and thus the capacitance of the site between the photoelectric conversion unit 11 and the read Tr 42 cannot be controlled. Therefore, as illustrated in B of FIG. 4, when signal charges are generated and accumulated by photoelectric conversion, the voltage to be applied to the photoelectric conversion unit 11 decreases. Thus, the configuration of the pixel disclosed in Patent Document 5 cannot solve the problem that the voltage of the photoelectric conversion unit 11 varies depending on the amount of signal charges and the photoelectric conversion characteristic (photoelectric conversion efficiency) varies.

Thus, a pixel configuration of restricting a deterioration in photoelectric conversion characteristic (photoelectric conversion efficiency) and restricting a deterioration in image quality will be described below as compared with the basic pixel 1.

Note that the parts corresponding to the components in the basic pixel 1 described above are denoted with the same reference numerals and the description thereof will be omitted as needed in each embodiment described later.

2. First Embodiment

A first embodiment of a pixel to which the present technology is applied will be described with reference to FIG. 5 to FIG. 7.

Figure 5:
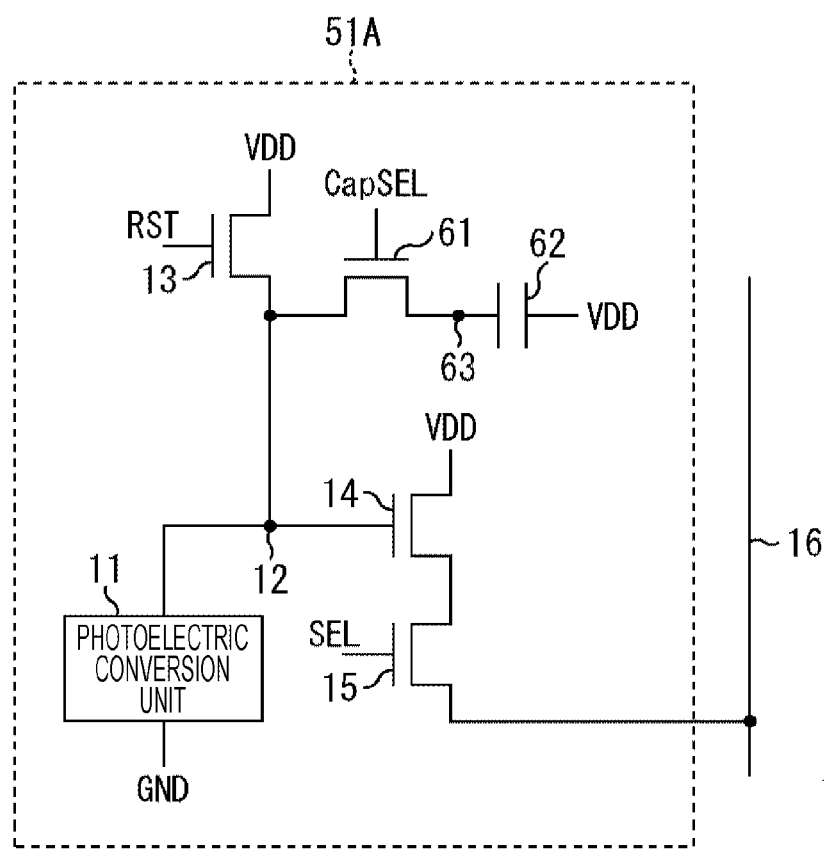
FIG. 5 is a diagram illustrating an equivalent circuit of a pixel according to a first embodiment.

FIG. 5 illustrates an equivalent circuit of a pixel 51A according to the first embodiment.

The pixel 51A illustrated in FIG. 5 has the photoelectric conversion unit 11, the charge holding unit 12, the reset transistor 13, the amplification transistor 14, the select transistor 15, a capacitance switching transistor 61, and an additional capacitance device 62.

That is, the pixel 51A is newly provided with the capacitance switching transistor 61 and the additional capacitance device 62 in addition to the components of the basic pixel 1 illustrated in FIG. 1. A source of the capacitance switching transistor 61 is connected to the charge holding unit 12, and a drain thereof is connected to one end of the additional capacitance device 62. A connection node 63 indicates a connection point between the capacitance switching transistor 61 and the additional capacitance device 62. The other end of the additional capacitance device 62 is connected to the power supply voltage VDD.

The capacitance switching transistor 61 switches the capacitance of the charge holding unit 12 by connecting the additional capacitance device 62 to the charge holding unit 12 or separating it from the charge holding unit 12 in response to a switching control signal CapSEL supplied to a gate of the capacitance switching transistor 61.

Figure 6:
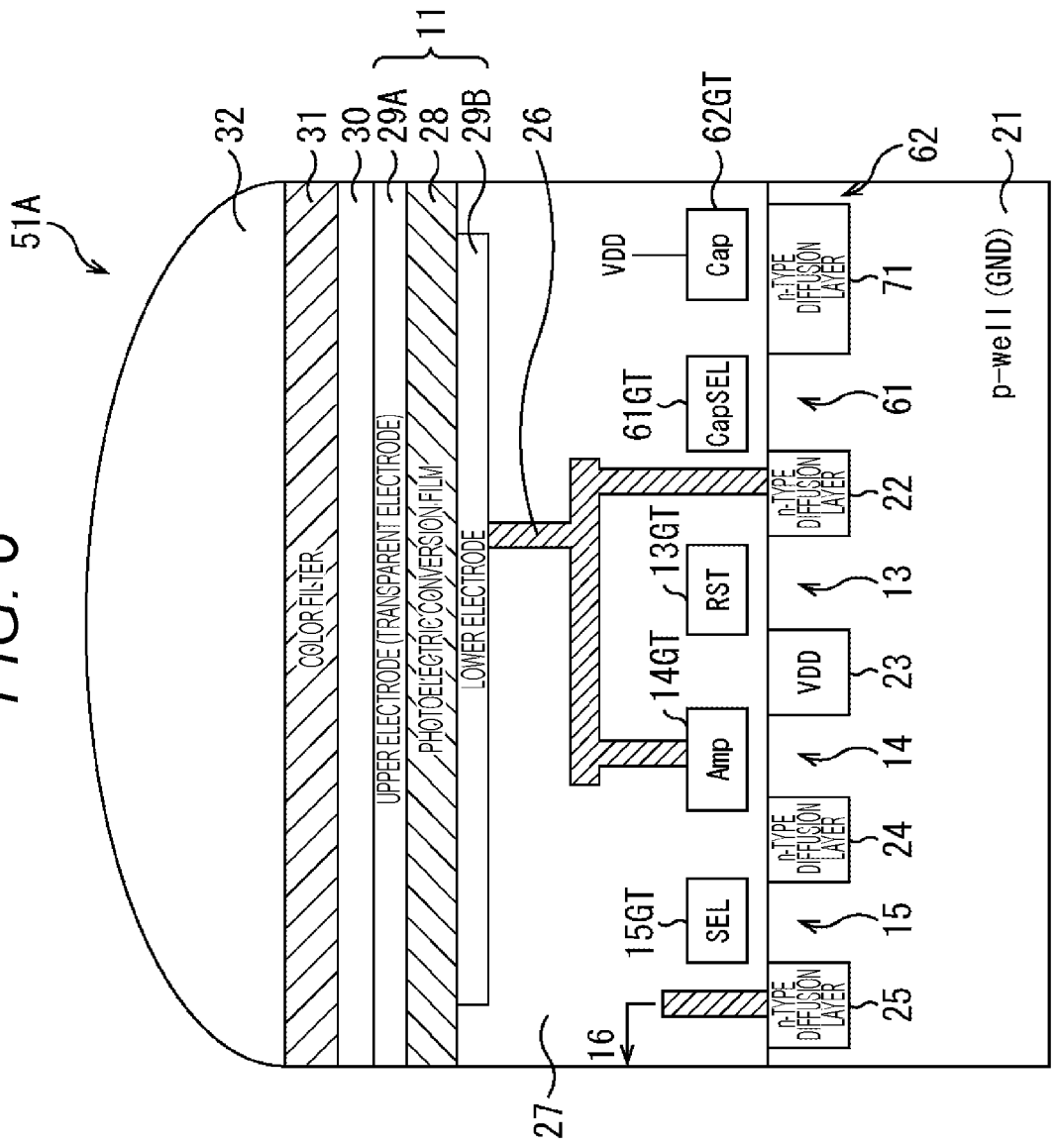
FIG. 6 is a diagram illustrating a cross-section structure of the pixel according to the first embodiment.

FIG. 6 is a diagram illustrating a cross-section structure of the pixel 51A.

In the cross-section structure of the pixel 51A illustrated in FIG. 6, a gate part 61GT of the capacitance switching transistor 61 and an n-type diffusion layer 71 are newly added according to the addition of the capacitance switching transistor 61. Further, a gate part 62GT of the additional capacitance device 62 is newly added according to the addition of the additional capacitance device 62. The additional capacitance device 62 is configured of a MOS capacitor formed of the n-type diffusion layer 71 and the gate part 62GT.

Furthermore, the n-type diffusion layer 22 functioning as the source of the reset transistor 13 in FIG. 2 serves as the source of the capacitance switching transistor 61 according to the first embodiment. The n-type diffusion layer 71 serves as the drain of the capacitance switching transistor 61 and one end of the additional capacitance device 62.

First Drive

There will be described below how to drive (first drive) the pixel 51A according to the first embodiment with reference to FIG. 7.

The pixel 51A first detects a signal level (reset signal level) of a state before signal accumulation, and accumulates signal charges, and then reads the accumulated signal charges thereby to perform the correlated double sampling (CDS) processing of finding a difference between the reset signal level before accumulation and the signal level (accumulation signal level) after accumulation. The CDS processing enables a pixel-specific fixed pattern noise such as kTC noise, or a threshold variation of the amplification transistor 14 to be canceled.

Figure 7:
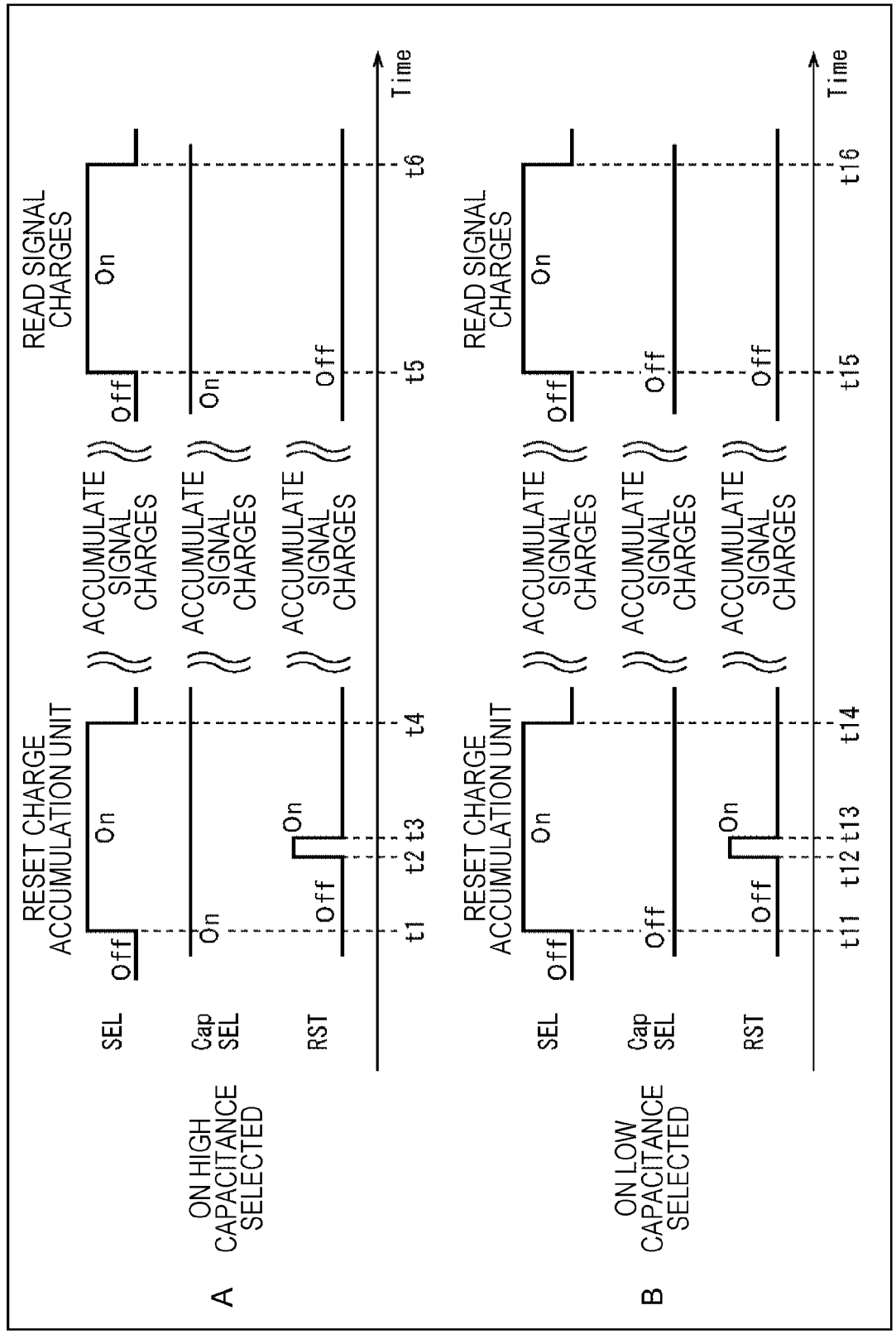
FIG. 7 is a diagram for explaining how to drive the pixel according to the first embodiment.

FIG. 7 illustrates the timing charts of the signals supplied to the respective gates of the select transistor 15, the reset transistor 13, and the capacitance switching transistor 61 for the CDS processing performed by the pixel 51A.

A of FIG. 7 illustrates how to drive in a case where the capacitance of the charge holding unit 12 is increased for more signal charges (on high capacitance selected, below), and B of FIG. 7 illustrates how to drive in a case where the capacitance of the charge holding unit 12 is decreased to increase a gain for less signal charges (on low capacitance selected, below). Either the high capacitance setting in A of FIG. 7 or the low capacitance setting in B of FIG. 7 is selected under control of a control circuit 405 or a signal processing circuit 406 (FIG. 24) described later so that the pixel 51A is driven.

On high capacitance selected, the gate part 61GT of the capacitance switching transistor 61 is supplied with a High (Hi) switching control signal CapSEL and the capacitance switching transistor 61 is turned on before each pixel 51A starts being driven. On high capacitance selected, the capacitance switching transistor 61 is set to be always on.

Then, at time t1 when the select transistor 15 is off and the reset transistor 13 is off, the select signal SEL enters Hi and the select transistor 15 is turned on.

Subsequently, the reset transistor 13 is turned on at time t2 while the select transistor 15 is on, and the reset transistor 13 is turned off at time t3 so that the voltage of the charge holding unit 12 is reset at the power supply voltage VDD in the initial state. Further, the capacitance switching transistor 61 is on, and thus the additional capacitance device 62 connected to the charge holding unit 12 via the capacitance switching transistor 61 is also reset at the same time.

Thereafter, at time t4, the select transistor 15 is turned off and then the signal charges start being accumulated.

After the accumulation of the signal charges is completed, the select transistor 15 is turned on at time t5 so that the signal charges accumulated in the charge holding unit 12 are output to a memory or the like in the AD conversion unit via the sequence signal line 16.

After the accumulated signal charges finish being read, the select transistor 15 is turned off at time t6.

On the other hand, on low capacitance selected, before each pixel 51A starts being driven, the gate part 61GT of the capacitance switching transistor 61 is supplied with a Low (Lo) switching control signal CapSEL and the capacitance switching transistor 61 is turned off. On low capacitance selected, the capacitance switching transistor 61 is set to be always off. How to drive other than the capacitance switching transistor 61 is the same as on high capacitance selected.

That is, at time t11 when the select transistor 15 is off and the reset transistor 13 is off, the select signal SEL enters Hi and the select transistor 15 is turned on.

Subsequently, the reset transistor 13 is turned on at time t12 while the select transistor 15 is on, and the reset transistor 13 is turned off at time t13 so that the voltage of the charge holding unit 12 is reset in the initial state. The capacitance switching transistor 61 is off, and thus the additional capacitance device 62 is separated from the charge holding unit 12.

Thereafter, at time t14, the select transistor 15 is turned off and then the signal charges start being accumulated.

After the accumulation of the signal charges is completed, the select transistor 15 is turned on at time t15 so that the signal charges accumulated in the charge holding unit 12 are output to a memory or the like in the AD conversion unit via the sequence signal line 16.

After the accumulated signal charges finish being read, the select transistor 15 is turned off at time t16.

Effects of First Embodiment

According to the first embodiment described above, the capacitance of the charge holding unit 12 connected to the photoelectric conversion unit 11 is controlled depending on the amount of signal charges thereby to control the voltage amplitude of the charge holding unit 12. That is, in a case where a large amount of signal charges are present, the capacitance switching transistor 61 is turned on to increase the capacitance of the charge holding unit 12 so that an increase in voltage of the charge holding unit 12 is restricted and a decrease in applied voltage of the photoelectric conversion unit 11 is restricted. Thereby, a deterioration in photoelectric conversion efficiency of the photoelectric conversion unit 11 can be restricted.

Further, according to the first embodiment, the capacitance switching transistor 61 as a switch is inserted between the additional capacitance device 62 and the charge holding unit 12. Thereby, in a case where the charge holding unit 12 is used at low capacitance, a leak current occurring in the additional capacitance device 62 can be prevented from mixing into the charge holding unit 12.

Therefore, a deterioration in photoelectric conversion characteristic (photoelectric conversion efficiency) can be restricted and a deterioration in image quality of the solid-state image sensing device can be restricted.

3. Second Embodiment

A second embodiment of a pixel to which the present technology is applied will be described below with reference to FIG. 8 to FIG. 12.

Figure 8:
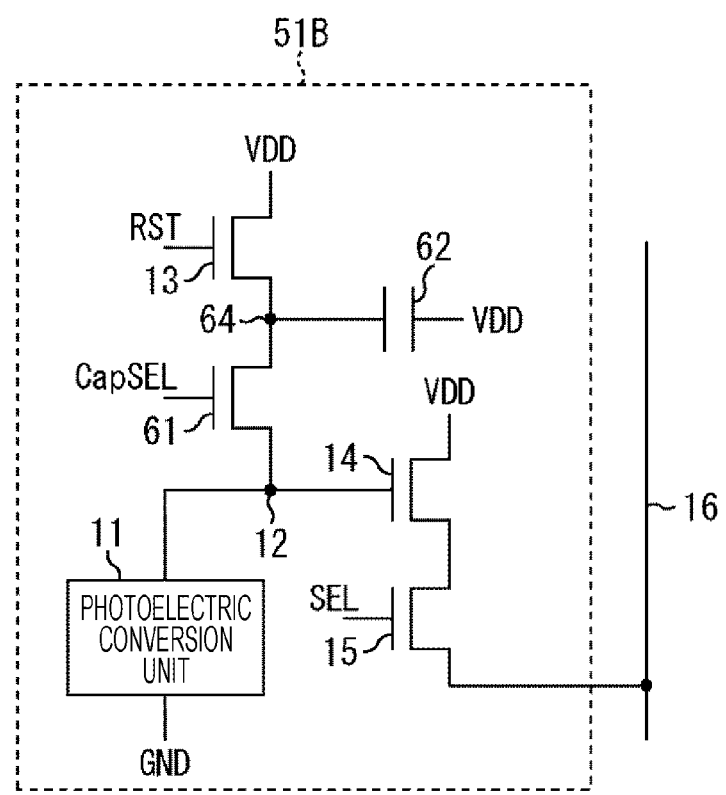
FIG. 8 is a diagram illustrating an equivalent circuit of a pixel according to a second embodiment.
Figure 9:
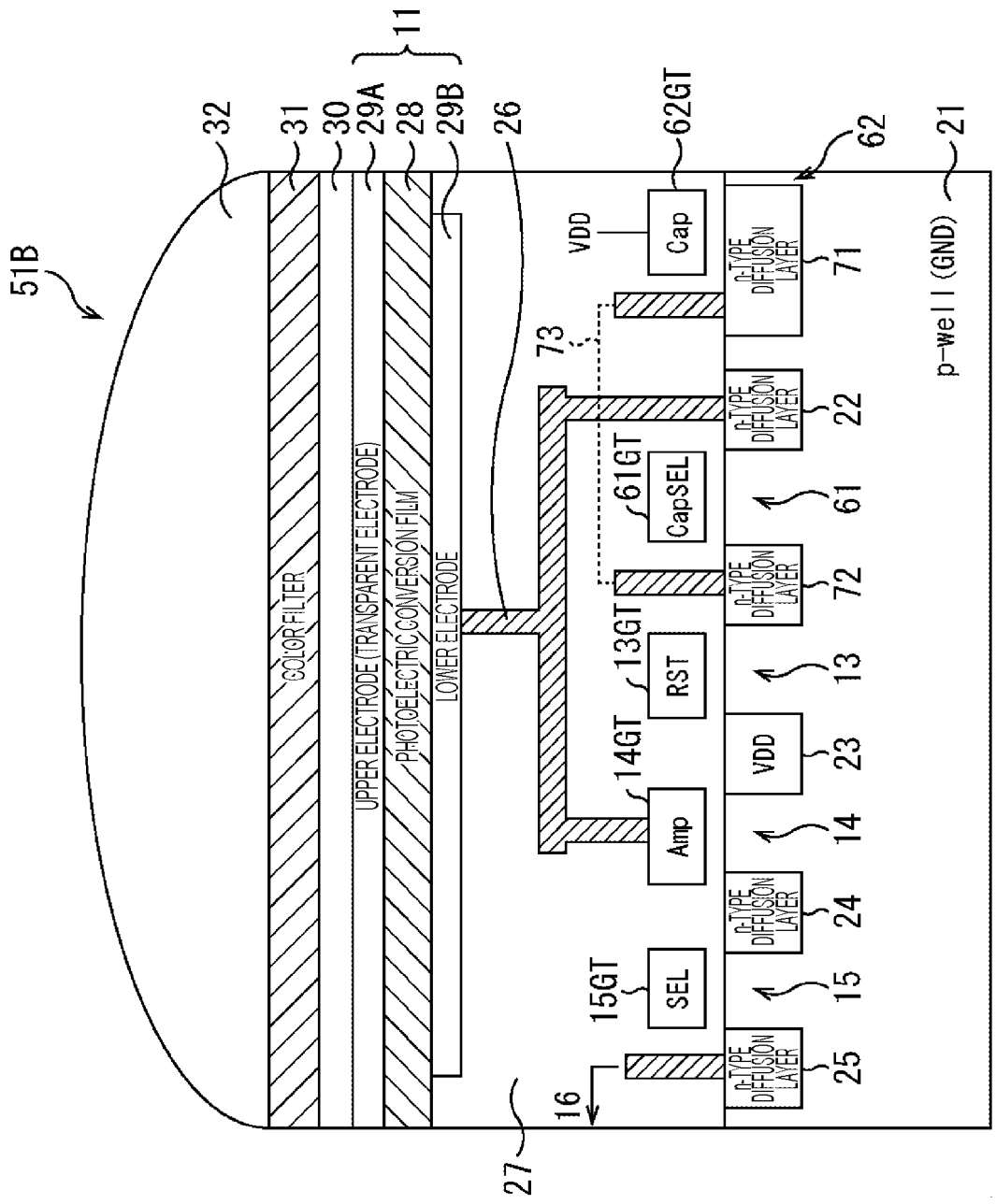
FIG. 9 is a diagram illustrating a cross-section structure of the pixel according to the second embodiment.

FIG. 8 illustrates an equivalent circuit of a pixel 51B according to the second embodiment, and FIG. 9 illustrates a cross-section structure of the pixel 51B according to the second embodiment.

The first embodiment described above is configured such that the reset transistor 13 and the capacitance switching transistor 61 are connected in parallel. To the contrary, the second embodiment is different from the first embodiment in that the capacitance switching transistor 61 is inserted between the reset transistor 13 and the charge holding unit 12 and the reset transistor 13 and the capacitance switching transistor 61 are connected in series as illustrated in FIG. 8.

More specifically, the source of the capacitance switching transistor 61 is connected to the charge holding unit 12, and the drain thereof is connected to the source of the reset transistor 13 and one end of the additional capacitance device 62. A connection node 64 is a connection point of the reset transistor 13, the capacitance switching transistor 61, and the additional capacitance device 62.

In the cross-section structure of the pixel 51B illustrated in FIG. 9, an n-type diffusion layer 72 serving as the source of the reset transistor 13 and the drain of the capacitance switching transistor 61 is newly added. The n-type diffusion layer 72 is connected to the n-type diffusion layer 71 at one end of the additional capacitance device 62 in the substrate, or is connected thereto via a metal wiring 73 provided in the insulative layer 27. Thereby, the n-type diffusion layer 71 of the additional capacitance device 62 is connected to the charge holding unit 12 via the capacitance switching transistor 61.

Second Drive

There will be described below how to drive (second drive) the pixel 51B according to the second embodiment with reference to the timing charts of FIG. 10.

Figure 10:
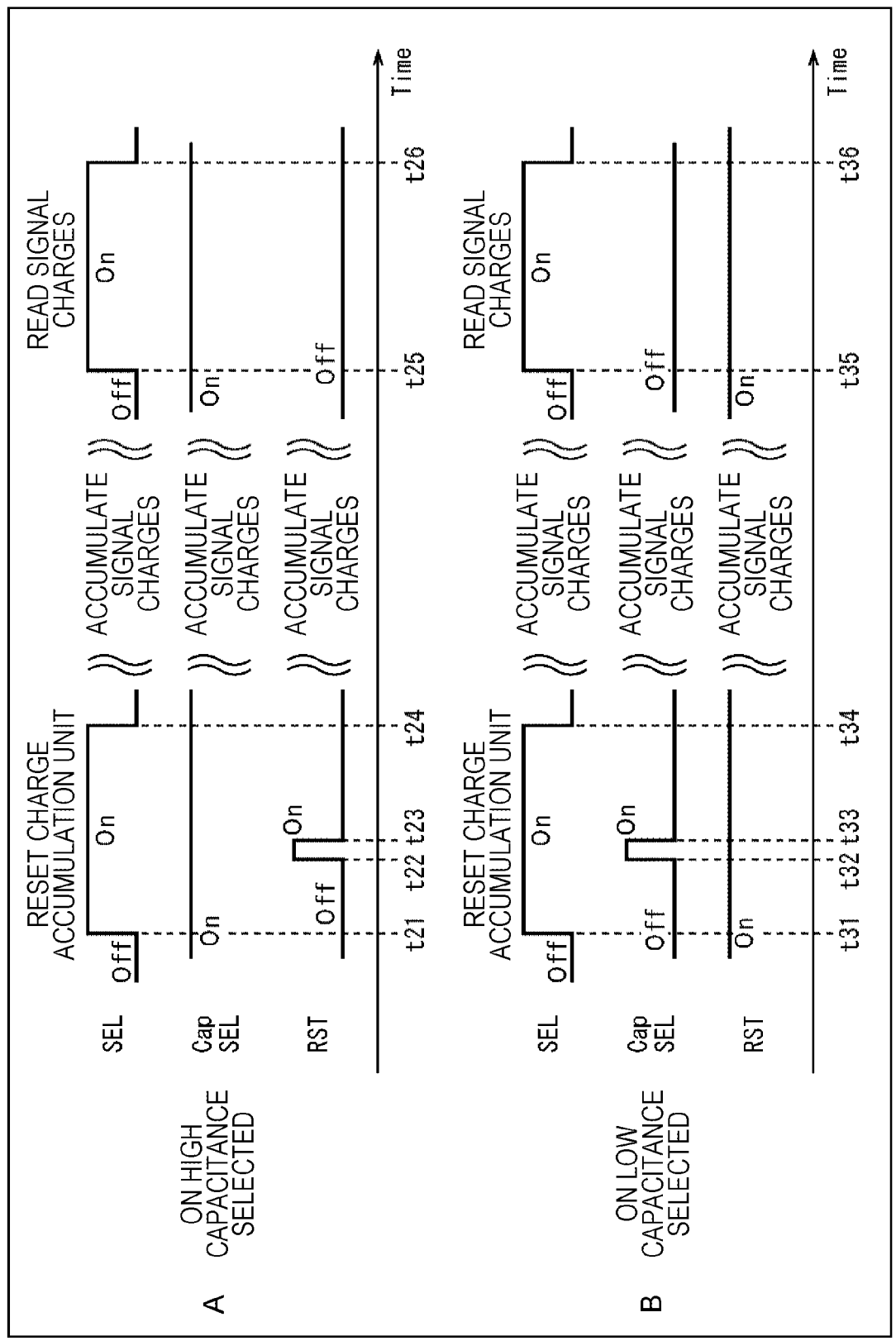
FIG. 10 is a diagram for explaining how to drive the pixel according to the second embodiment.

How to drive on high capacitance selected illustrated in A of FIG. 10 is the same as how to drive on high capacitance selected according to the first embodiment, and thus the description thereof will be omitted.

On the other hand, on low capacitance selected, the reset transistor 13 is always on, and instead the capacitance switching transistor 61 operates as the reset transistor 13.

Specifically, after the select transistor 15 is turned on at time t31, the capacitance switching transistor 61 is turned on at time t32 and is turned off at time t33. Thereby, the voltage of the charge holding unit 12 is reset in the initial state.

Thereafter, the select transistor 15 is turned off and then the signal charges start being accumulated at time t34.

After the accumulation of the signal charges is completed, the select transistor 15 is turned on at time t35 so that the signal charges accumulated in the charge holding unit 12 are output to a memory or the like in the AD conversion unit via the sequence signal line 16.

After the accumulated signal charges finish being read, the select transistor 15 is turned off at time t36.

Effects of Second Embodiment

The differences between the first embodiment and the second embodiment will be described with reference to FIG. 11 and FIG. 12.

In the pixel 51A according to the first embodiment, the connection node 63 (FIG. 5) between the capacitance switching transistor 61 and the additional capacitance device 62 is a floating node on low capacitance selected.

Figure 11:
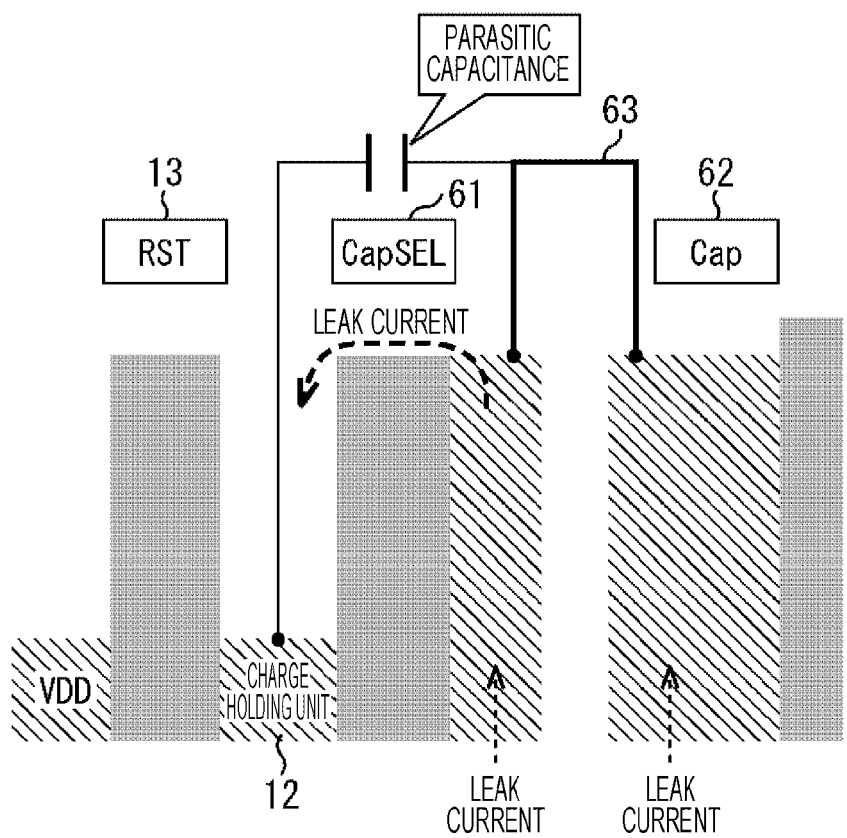
FIG. 11 is a diagram for explaining a difference between the first embodiment and the second embodiment.

FIG. 11 illustrates a state of the pixel 51A according to the first embodiment on low capacitance selected.

Typically, a parasitic capacitance is present between the connection node 63 and the charge holding unit 12, and there is a concern that when the potential of the connection node 63 varies in reading the reset signal level and in reading the accumulation signal level after the signal charge accumulation, the potential of the charge holding unit 12 varies due to coupling, which causes a noise of the signal charges. Further, the connection node 63 is connected to the charge holding unit 12 via the capacitance switching transistor 61, and thus there is a concern that a leak current occurring during the signal charge accumulation is mixed into the charge holding unit 12.

Figure 12:
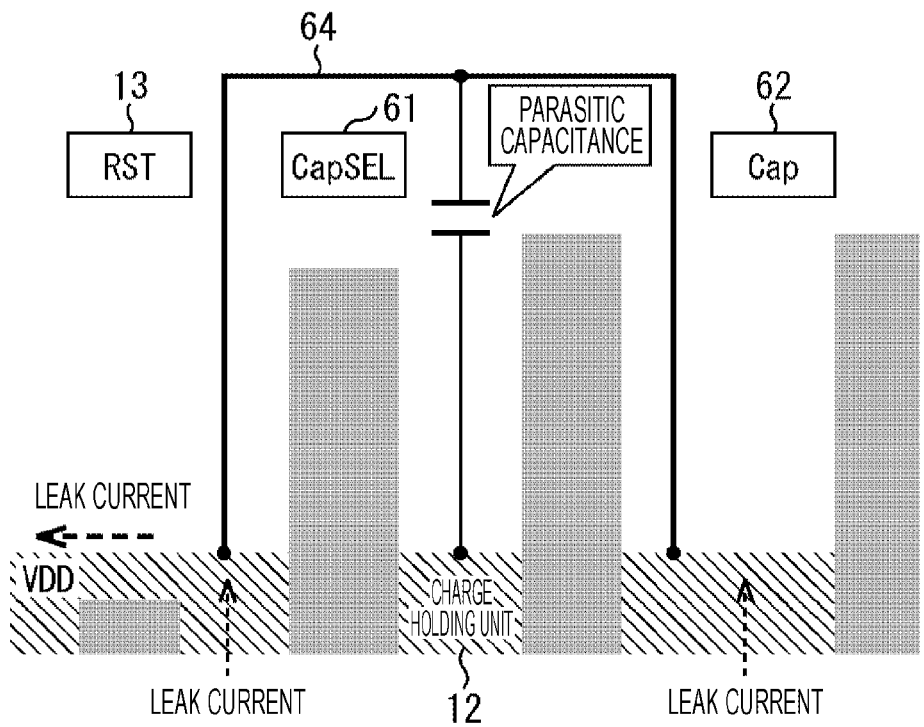
FIG. 12 is a diagram for explaining a difference between the first embodiment and the second embodiment.

To the contrary, FIG. 12 illustrates a state of the pixel 51B according to the second embodiment on low capacitance selected.

As described above, the capacitance switching transistor 61 is inserted between the reset transistor 13 and the charge holding unit 12 in the pixel 51B, and the reset transistor 13 is controlled to be on always on low capacitance selected. Thereby, on low capacitance selected, as illustrated in FIG. 12, the potential of the connection node 64 (FIG. 8) between the capacitance switching transistor 61 and the additional capacitance device 62 is fixed at the power supply voltage VDD, thereby restricting a variation in potential of the charge holding unit 12 due to coupling. Further, a leak current occurring in the connection node 64 is all discharged to the drain of the reset transistor 13, thereby restricting a leak current from mixing into the charge holding unit 12.

Therefore, the structure of the pixel 51B according to the second embodiment enables a variation in potential of the charge holding unit 12 due to coupling on low capacitance selected or a mixture of a leak current into the charge holding unit 12, which occurs in the first embodiment, to be restricted. Thereby, according to the second embodiment, a deterioration in image quality of the solid-state image sensing device can be further restricted in addition to the effects of the first embodiment described above.

4. Third Embodiment

A third embodiment of a pixel to which the present technology is applied will be described below with reference to FIG. 13 to FIG. 16.

Figure 13:
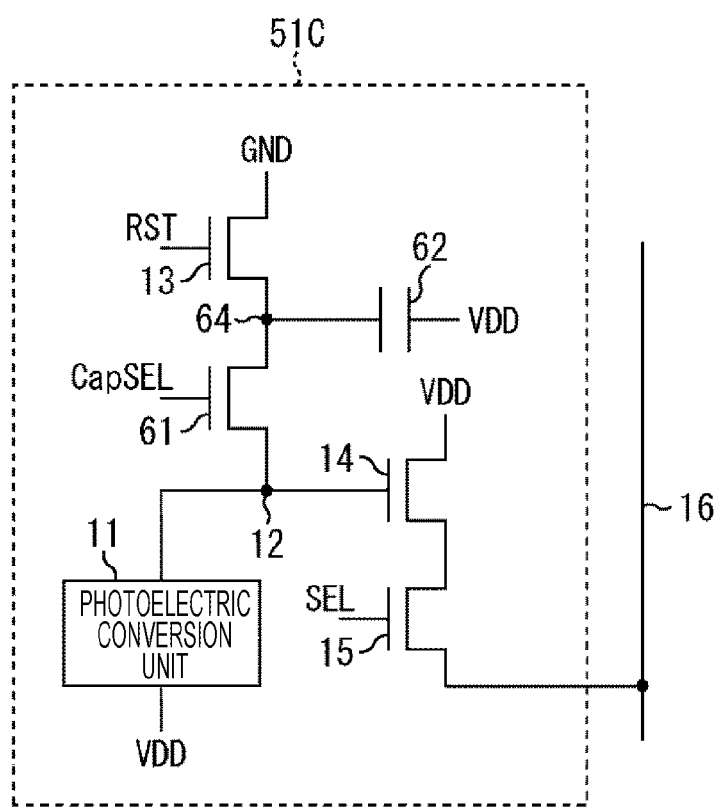
FIG. 13 is a diagram illustrating an equivalent circuit of a pixel according to a third embodiment.
Figure 14:
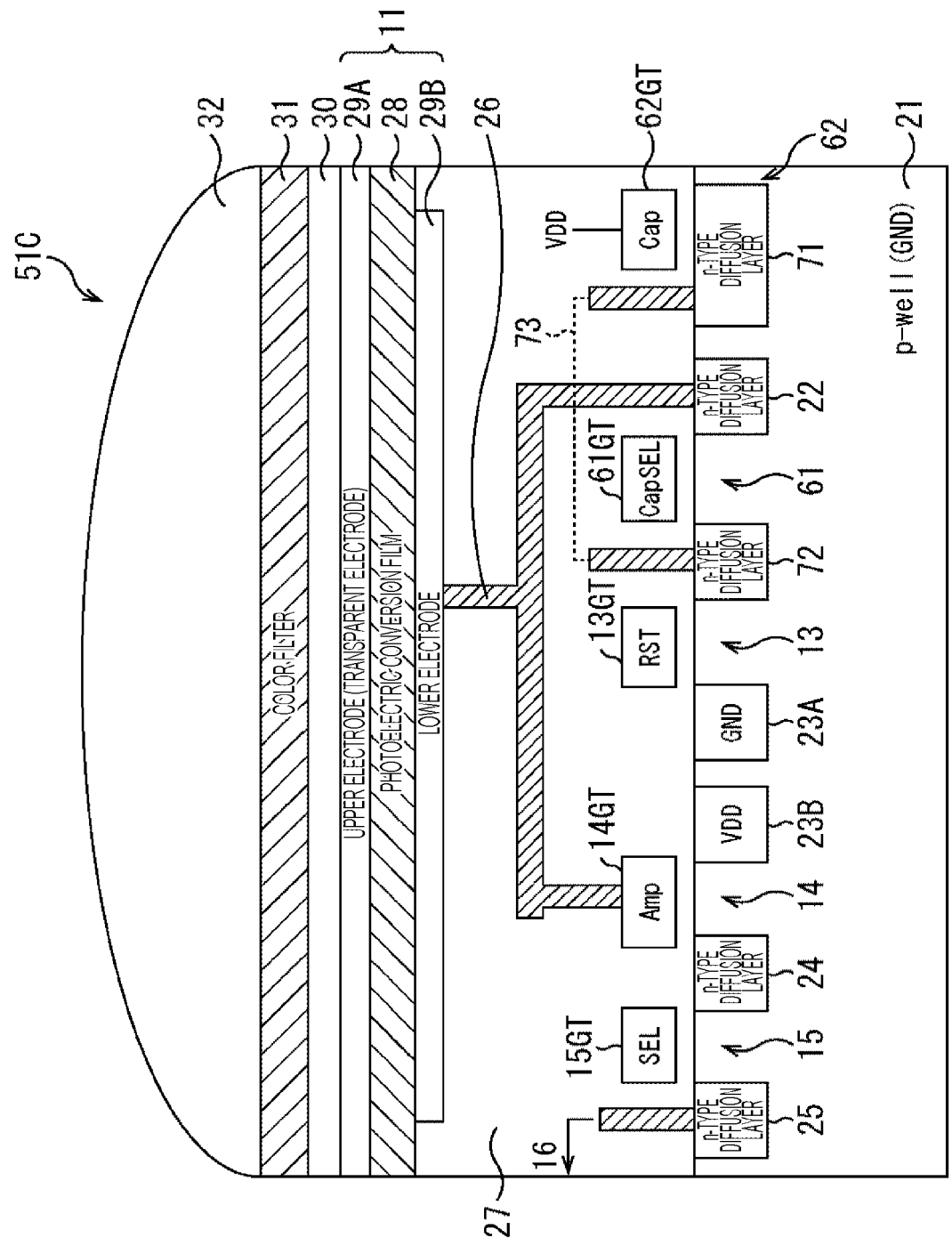
FIG. 14 is a diagram illustrating a cross-section structure of the pixel according to the third embodiment.

FIG. 13 illustrates an equivalent circuit of a pixel 51C according to the third embodiment, and FIG. 14 illustrates a cross-section structure of the pixel 51C according to the third embodiment.

The first and second embodiments described above employ electrons as signal charges, while the third embodiment is different from the first and second embodiments in that holes are employed as signal charges.

Since holes are employed as signal charges, the power supply voltage VDD is applied to the upper electrode 29A at one end of the photoelectric conversion unit 11. Further, the reset transistor 13 is connected not to the power supply voltage VDD but to GND.

In FIG. 9 of the second embodiment, the n-type diffusion layer 23 in the P-type semiconductor substrate 21 is shared by the reset transistor 13 and the amplification transistor 14. According to the third embodiment, however, an n-type diffusion layer 23A for the reset transistor 13 and an n-type diffusion layer 23B for the amplification transistor 14 are separately formed as illustrated in FIG. 14. Then, the n-type diffusion layer 23A for the reset transistor 13 is connected to GND, and the n-type diffusion layer 23B for the amplification transistor 14 is connected to the power supply voltage VDD.

Other components according to the third embodiment are similar to those according to the second embodiment described above, and how to drive the pixel is similar to the second drive described with reference to FIG. 10, and the description thereof will be omitted.

Effects of Third Embodiment

The differences between the second embodiment and the third embodiment will be described with reference to FIG. 15 and FIG. 16.

Figure 15:
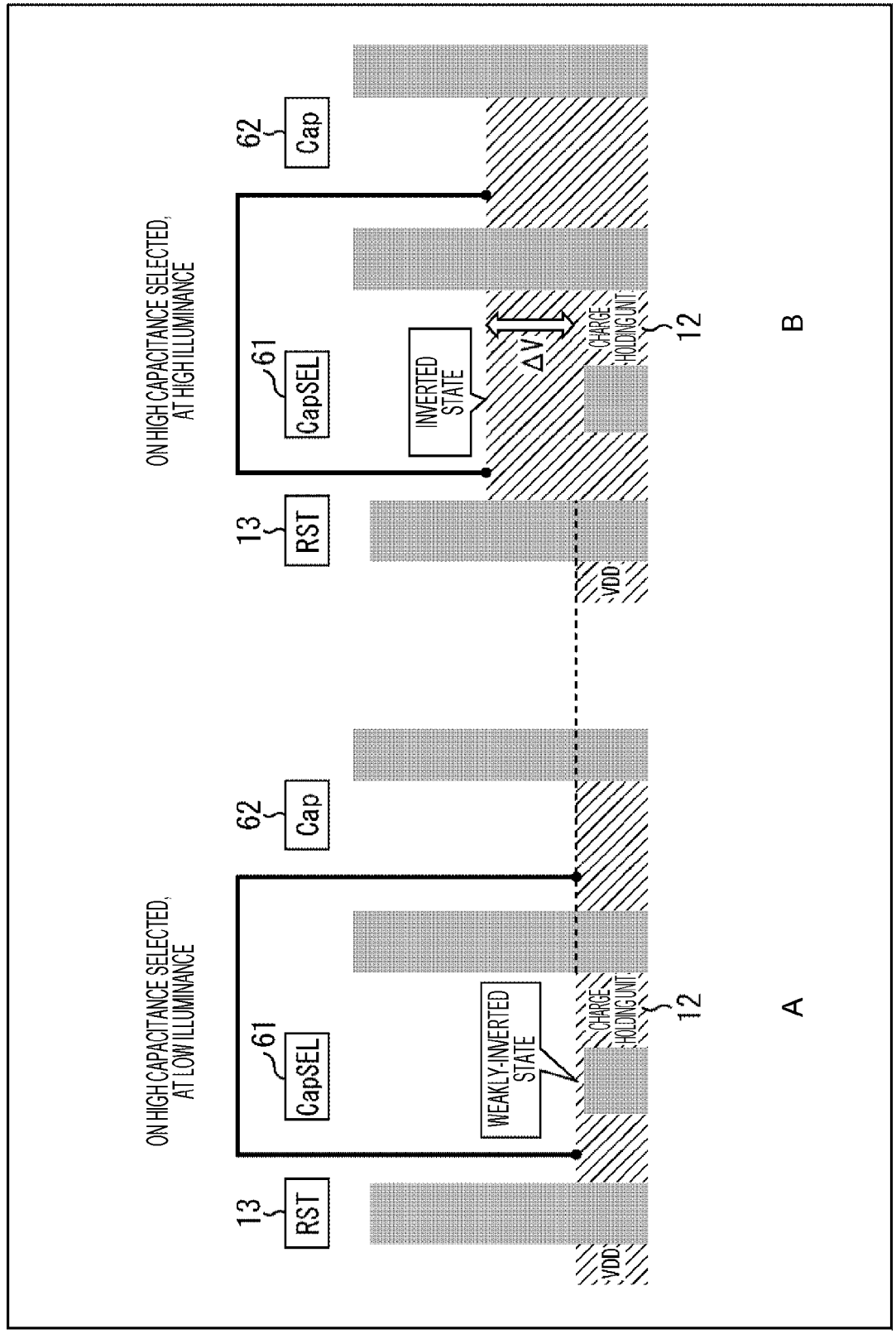
FIG. 15 is a diagram for explaining a difference between the second embodiment and the third embodiment.

FIG. 15 illustrates the states of the second embodiment on high capacitance selected.

On high capacitance selected, the potential at the bottom of the gate part 61GT of the capacitance switching transistor 61 changes depending on the amount of signal charges. In a case where the charge holding unit 12 is reset at the power supply voltage VDD, the bottom of the gate part 61GT of the capacitance switching transistor 61 has less electrons immediately after the reset, and is in a weakly-inverted state as illustrated in A of FIG. 15. Then, the state changes to an inverted state as illustrated in B of FIG. 15 along with charge accumulation. Consequently, the capacitance at the bottom of the gate part 61GT of the capacitance switching transistor 61 varies, and the QV conversion efficiency changes depending on the signal charges. The phenomenon deteriorates the linearity property of the solid-state image sensing device. Incidentally, the description has been made herein by use of the second embodiment, but a similar phenomenon is caused also according to the first embodiment.

Figure 16:
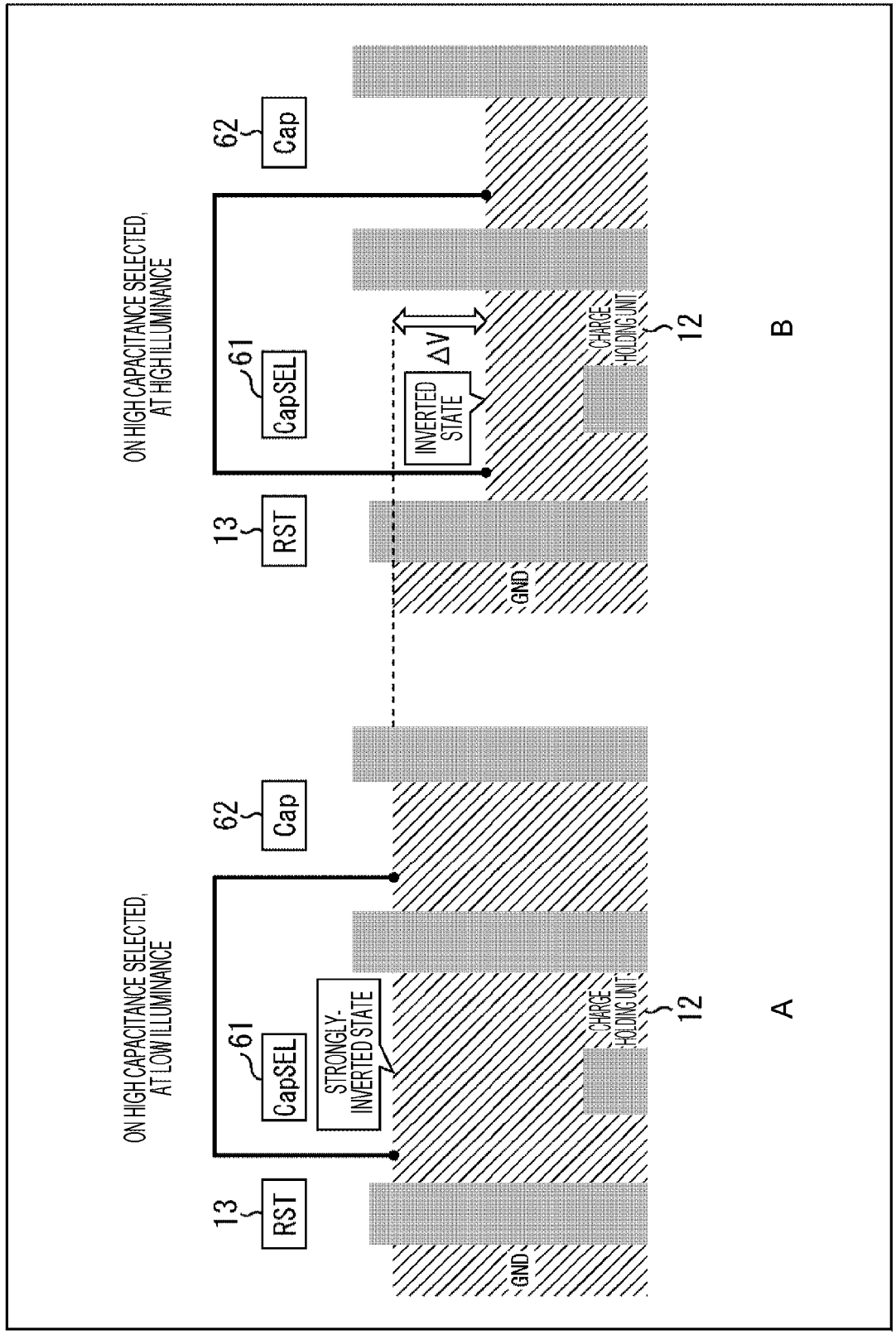
FIG. 16 is a diagram for explaining a difference between the second embodiment and the third embodiment.

FIG. 16) illustrates the states of the third embodiment on high capacitance selected.

According to the third embodiment, the reset potential of the charge holding unit 12 is assumed at GND. Further, signal charges are holes. Therefore, according to the third embodiment, the bottom of the gate part 61GT of the capacitance switching transistor 61 is used from a strongly-inverted state as illustrated in A of FIG. 16, and the bottom of the gate part 61GT of the capacitance switching transistor 61 gradually changes to an inverted state as illustrated in B of FIG. 16. Thereby, the gate part 61GT of the capacitance switching transistor 61 can be restricted from being depleted during signal charge accumulation, and broken linearity due to a variation in capacitance can be restricted.

Further, the charge holding unit 12 is reset at the same GND potential as the P-type semiconductor substrate (P-Well) 21 so that a potential difference between the charge holding unit 12 and the P-type semiconductor substrate 21 can be restricted at low illuminance and a noise can be restricted at low illuminance.

Therefore, the structure of the pixel 51C according to the third embodiment enables broken linearity due to a variation in capacitance to be restricted, and a noise in the charge holding unit 12 at low illuminance to be restricted in addition to the effects of the first and second embodiments described above, thereby further restricting a deterioration in image quality of the solid-state image sensing device.

5. Fourth Embodiment

A fourth embodiment of a pixel to which the present technology is applied will be described with reference to FIG. 17 to FIG. 20.

Figure 17:
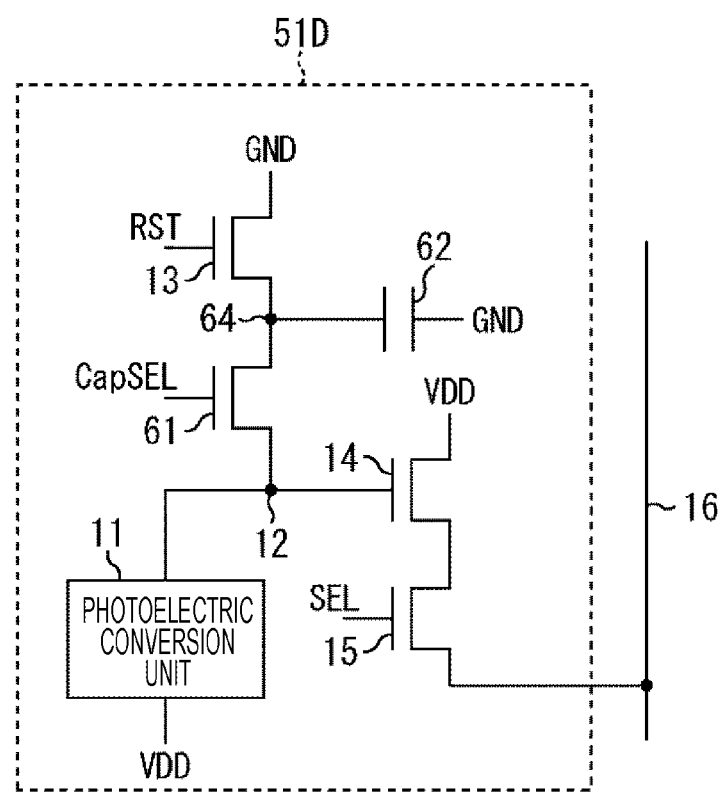
FIG. 17 is a diagram illustrating an equivalent circuit of a pixel according to a fourth embodiment.
Figure 18:
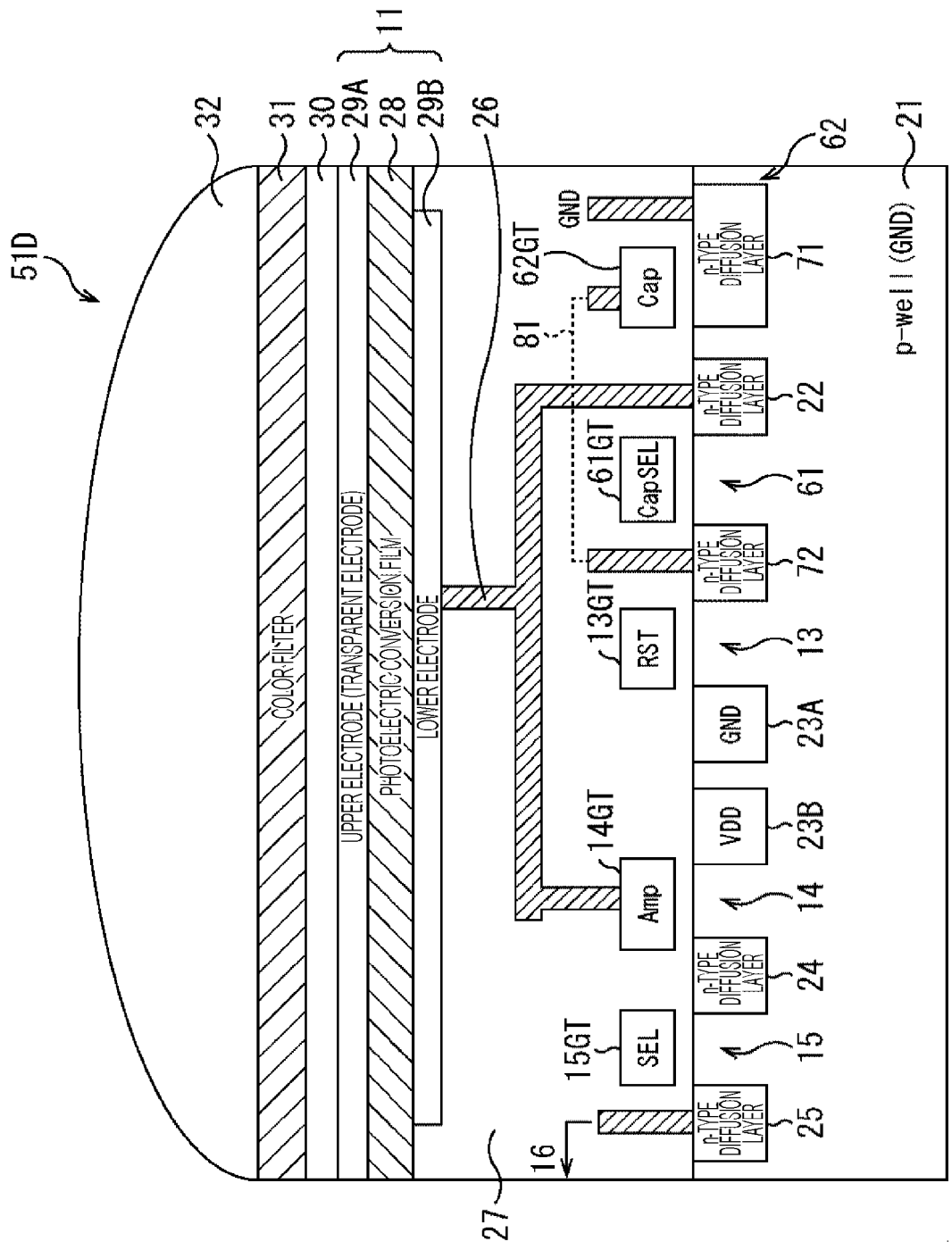
FIG. 18 is a diagram illustrating a cross-section structure of the pixel according to the fourth embodiment.

FIG. 17 illustrates an equivalent circuit of a pixel 51D according to the fourth embodiment, and FIG. 18 illustrates a cross-section structure of the pixel 51D according to the fourth embodiment.

The equivalent circuit of the pixel 51D illustrated in FIG. 17 is different from the third embodiment described above in that the node of the additional capacitance device 62, which is opposite to the connection node 64 closer to the reset transistor 13, is connected not to the power supply voltage VDD but to GND.

The cross-section structure of the pixel 51D illustrated in FIG. 18 is such that the gate part 62GT of the additional capacitance device 62 as MOS capacitor is connected to the n-type diffusion layer 72 of the capacitance switching transistor 61 via a metal wiring 81 provided in the insulative layer 27 and the gate part 62GT of the additional capacitance device 62 is connected to the charge holding unit 12 via the capacitance switching transistor 61. The n-type diffusion layer 71 of the additional capacitance device 62 is connected to GND. Other points are similar to the third embodiment described above.

Effects of Fourth Embodiment

The differences between the third embodiment and the fourth embodiment will be described with reference to FIG. 19 and FIG. 20.

Figure 19:
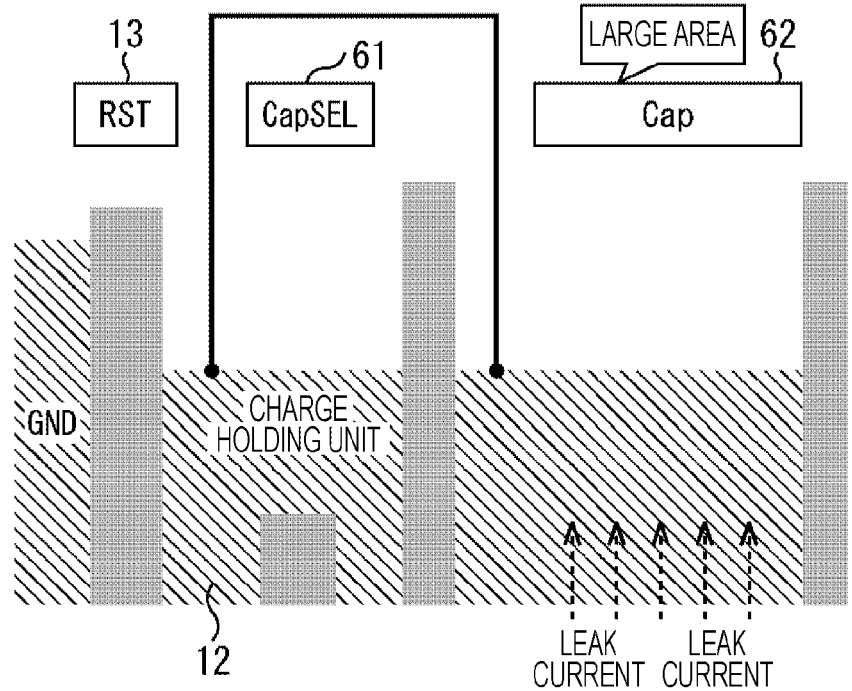
FIG. 19 is a diagram for explaining a difference between the third embodiment and the fourth embodiment.

FIG. 19 illustrates a state of the third embodiment on high capacitance selected.

The amount of saturation charges of the charge holding unit 12 is determined by the capacitance of the charge holding unit 12 on high capacitance selected, and the range of a voltage usable by the charge holding unit 12. A high capacitance needs to be added to the charge holding unit 12 in order to improve the amount of saturation charges.

In the pixel 51C according to the third embodiment, the additional capacitance device 62 is configured of a MOS capacitor, and the n-type diffusion layer 71 as a node of the additional capacitance device 62 closer to the P-type semiconductor substrate 21 is connected to the charge holding unit 12 as illustrated in FIG. 14.

The node of the additional capacitance device 62 closer to the P-type semiconductor substrate 21 has a pn junction and a leak current occurs. Thus, the configuration has a concern that when the additional capacitance device 62 is increased in its area in order to increase the amount of saturation charges, a leak current flowing into the charge holding unit 12 increases.

Additionally, the concern of the increase in leak current is present also in the first and second embodiments similarly as in the third embodiment. Incidentally, the increase in leak current occurs at high illuminance on high capacitance selected according to the third embodiment, while it occurs at low illuminance according to the first and second embodiments since signal charges are electrons.

Figure 20:
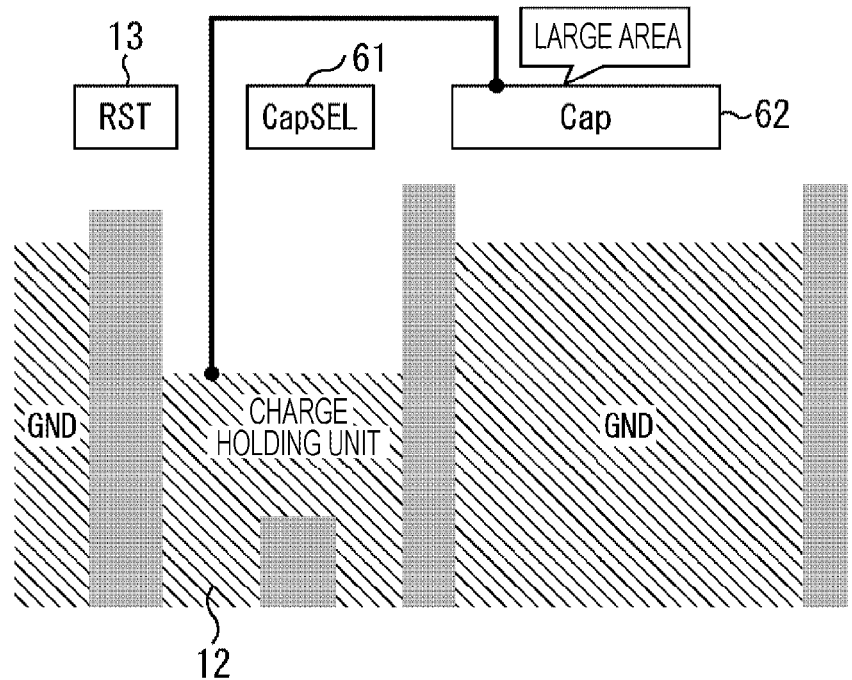
FIG. 20 is a diagram for explaining a difference between the third embodiment and the fourth embodiment.

To the contrary, FIG. 20 illustrates a state of the fourth embodiment on high capacitance selected.

In the pixel 51D according to the fourth embodiment, the gate part 62GT of the additional capacitance device 62 configured in a MOS capacitor is connected to the charge holding unit 12. Therefore, even if a leak current occurs in the n-type diffusion layer 71 in a MOS capacitor as pn junction, the leak current flows to GND, thereby restricting a leak current in the charge holding unit 12 when the additional capacitance device 62 is increased in its area.

Further, in the pixel 51D according to the fourth embodiment, the gate part 62GT of the additional capacitance device 62 is at the GND potential at low illuminance. Thus, the n-type diffusion layer 71 of the additional capacitance device 62 closer to the P-type semiconductor substrate 21 is assumed at the GND potential. Thereby, the bottom of the gate part 62GT of the additional capacitance device 62 is restricted from being depleted, and a reduction in capacitance of the additional capacitance device 62 is restricted. Consequently, a variation in QV conversion efficiency relative to the amount of signal charges can be restricted.

Therefore, the structure of the pixel 51D according to the fourth embodiment enables a leak current in the charge holding unit 12 to be restricted when the capacitance is increased, and both an increase in dynamic range of the solid-state image sensing device and a restriction of noise to be achieved in addition to the effects of the first to third embodiments. Consequently, a deterioration in image quality of the solid-state image sensing device can be further restricted.

6. Fifth Embodiment

A fifth embodiment of a pixel to which the present technology is applied will be described with reference to FIG. 21 to FIG. 22.

Figure 21:
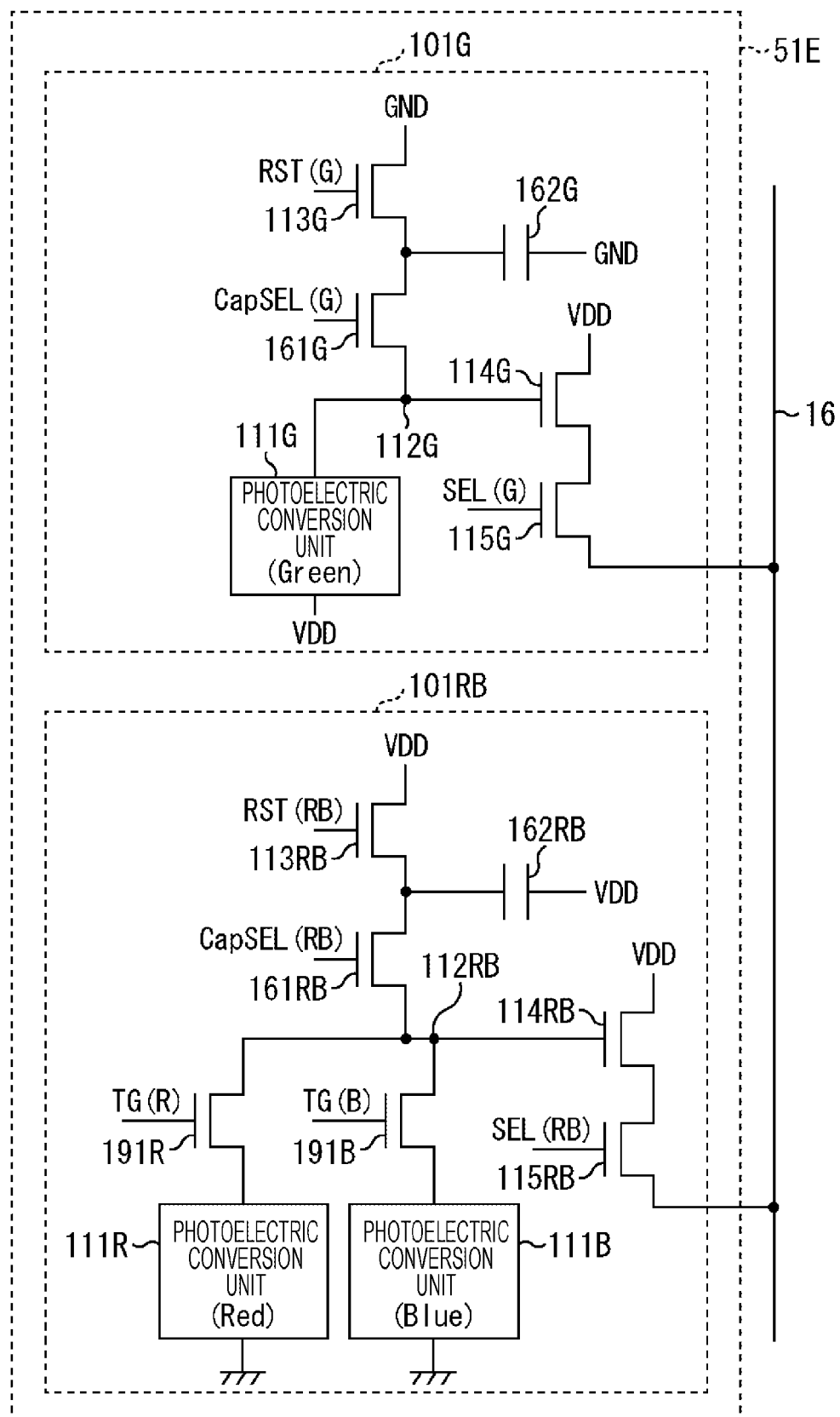
FIG. 21 is a diagram illustrating an equivalent circuit of a pixel according to a fifth embodiment.
Figure 22:
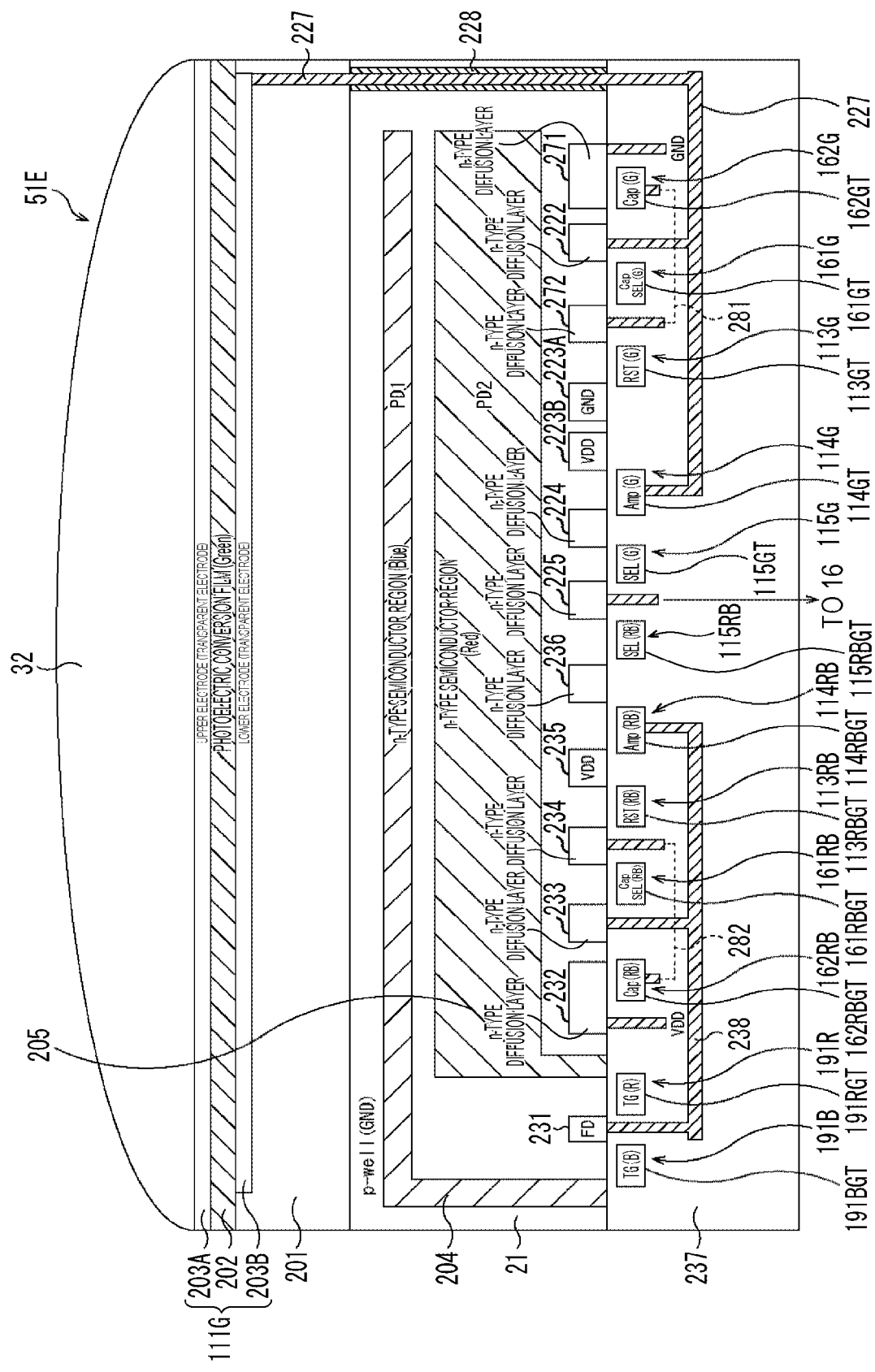
FIG. 22 is a diagram illustrating a cross-section structure of the pixel according to the fifth embodiment.

FIG. 21 illustrates an equivalent circuit of a pixel 51E according to the fifth embodiment, and FIG. 22 illustrates a cross-section structure of the pixel 51E according to the fifth embodiment.

The equivalent circuit of the pixel 51E is configured of a pixel circuit 101G for Green light as the first wavelength light and a pixel circuit 101RB for Red light as the second wavelength light and Blue light as the third wavelength light as illustrated in FIG. 21.

The pixel circuit 101G for Green light has the same configuration as the pixel 51D according to the fourth embodiment illustrated in FIG. 17.

That is, the pixel circuit 101G has a photoelectric conversion unit 111G, a charge holding unit 112G, a reset transistor 113G, an amplification transistor 114G, a select transistor 115G, a capacitance switching transistor 161G, and an additional capacitance device 162G.

The photoelectric conversion unit 111G, the charge holding unit 112G, the reset transistor 113G, the amplification transistor 114G, the select transistor 115G, the capacitance switching transistor 161G, and the additional capacitance device 162G in the pixel circuit 101G correspond to the photoelectric conversion unit 11, the charge holding unit 12, the reset transistor 13, the amplification transistor 14, the select transistor 15, the capacitance switching transistor 61, and the additional capacitance device 62 in the pixel 51D illustrated in FIG. 17, respectively.

On the other hand, in the pixel circuit 101RB for Red light and Blue light, a photoelectric conversion unit and a transfer transistor are provided for each of Red light and Blue light, and other components are shared for Red light and Blue light.

More specifically, the pixel circuit 101RB has a photoelectric conversion unit 111R, a photoelectric conversion unit 111B, a transfer transistor 191R, a transfer transistor 191B, a charge holding unit 112RB, a reset transistor 113RB, an amplification transistor 114RB, a select transistor 115RB, a capacitance switching transistor 161RB, and an additional capacitance device 162RB.

The photoelectric conversion unit 111R accumulates the charges obtained by receiving and photoelectrically converting Red lights. The photoelectric conversion unit 111B accumulates the charges obtained by receiving and photoelectrically converting Blue lights.

When turned on by a transfer signal TG(R) supplied to a gate of the transfer transistor 191R, the transfer transistor 191R transfers the signal charges generated in the photoelectric conversion unit 111R to the charge holding unit 112RB as FD unit. When turned on by a transfer signal TG(B) supplied to a gate of the transfer transistor 191B, the transfer transistor 191B transfers the signal charges generated in the photoelectric conversion unit 111B to the charge holding unit 112RB as FD unit.

The charge holding unit 112RB holds the signal chares transferred from the photoelectric conversion unit 111R or 111B.

When turned on by a reset signal RST (RB) supplied to a gate of the reset transistor 113RB, the reset transistor 113RB resets the potentials of the charge holding unit 112RB and the additional capacitance device 162RB.

A gate of the amplification transistor 114RB is connected to the charge holding unit 112RB, a drain thereof is connected to the power supply voltage VDD, and a source thereof is connected to a drain of the select transistor 115RB. The amplification transistor 114RB outputs a pixel signal depending on the potential of the charge holding unit 112RB.

The drain of the select transistor 115RB is connected to the source of the amplification transistor 114RB, a source of the select transistor 115RB is connected to the sequence signal line 16. When the pixel circuit 101RB is selected by a select signal SEL(RB) supplied to a gate of the select transistor 115RB, the select transistor 115RB is turned on and outputs a pixel signal corresponding to a Red light or Blue light received by the pixel 51E to the AD conversion unit via the sequence signal line 16.

A drain of the capacitance switching transistor 161RB is connected to a source of the reset transistor 113RB and one end of the additional capacitance device 162RB, and a source of the capacitance switching transistor 161RB is connected to the charge holding unit 112RB. The other end of the additional capacitance device 162RB, which is not connected to the reset transistor 113RB, is applied with the power supply voltage VDD.

FIG. 22 illustrates a cross-section structure of the pixel 51E according to the fifth embodiment.

The photoelectric conversion unit 111G is formed on the light incident surface of the P-type semiconductor substrate 21 via a protective film (insulative film) 201 in the pixel 51E. The photoelectric conversion unit 111G is configured such that a photoelectric conversion film 202 is sandwiched between an upper electrode 203A and a lower electrode 203B. A material of the photoelectric conversion film 202 employs a material photoelectrically converting a Green light and transmitting a Red light and a Blue light. An organic photoelectric conversion film for performing photoelectric conversion by a Green wavelength light may employ an organic photoelectric conversion material containing rhodamine-based pigment, merocyanine-based pigment, quinacridone, or the like. The upper electrode 203A and the lower electrode 203B are made of a transparent electrode film such as indium tin oxide (ITO) film or indium zinc oxide film, for example.

Additionally, in a case where the photoelectric conversion film 202 is an organic photoelectric conversion film for performing photoelectric conversion by a Red wavelength light, for example, an organic photoelectric conversion material containing phthalocyanine-based pigment may be employed. Further, for example, in a case where the photoelectric conversion film 202 is an organic photoelectric conversion film for performing photoelectric conversion by a Blue wavelength light, an organic photoelectric conversion material containing coumarin-based pigment, tris-8-hydroxyquinoline Al (Alq3), merocyanine-based pigment or the like may be employed. The on-chip lens 32 is formed on the photoelectric conversion unit 111G.

Two n-type semiconductor regions 204 and 205 are formed to be stacked in the depth direction in the P-type semiconductor substrate 21, and photodiodes PD1 and PD2 are formed by two PN junctions. The photodiode PD1 photoelectrically converts a Blue light and the photodiode PD2 photoelectrically converts a Red light due to a difference in light absorption coefficient. Part of the two n-type semiconductor regions 204 and 205 is formed to reach the interface at the bottom of the P-type semiconductor substrate 21.

The pixel transistors in the pixel 51E are formed on the lower surface of the P-type semiconductor substrate 21 opposite to the surface on which the photoelectric conversion unit 111G and the like are formed.

Specifically, the reset transistor 113G for Green light is configured of a gate part 113GT on the P-type semiconductor substrate 21, and n-type diffusion layers 223A and 272 in the P-type semiconductor substrate 21, and the amplification transistor 114G is configured of a gate part 114GT on the P-type semiconductor substrate 21, and n-type diffusion layers 223B and 224 in the P-type semiconductor substrate 21.

Further, the select transistor 115G is configured of a gate part 115GT on the P-type semiconductor substrate 21, and n-type diffusion layers 224 and 225 in the P-type semiconductor substrate 21. The n-type diffusion layer 224 is shared by the amplification transistor 114G and the select transistor 115G.

The capacitance switching transistor 161G is configured of a gate part 161GT on the P-type semiconductor substrate 21, and n-type diffusion layers 272 and 222 in the P-type semiconductor substrate 21, and the additional capacitance device 162G configured in a MOS capacitor is configured of a gate part 162GT on the P-type semiconductor substrate 21, and an n-type diffusion layer 271 in the P-type semiconductor substrate 21.

The gate part 162GT of the additional capacitance device 162G in a MOS capacitor is connected to the n-type diffusion layer 272 of the capacitance switching transistor 161G via a metal wiring 281 provided in an insulative layer 237, and the n-type diffusion layer 271 of the additional capacitance device 62 is connected to GND.

The signal charges generated by receiving Green lights are assumed as holes, and the upper electrode 203A of the photoelectric conversion film 202 is applied with the power supply voltage VDD. The lower electrode 203B of the photoelectric conversion film 202 is connected to the n-type diffusion layer 222 at one end of the source/drain of the capacitance switching transistor 161G, and the gate part 114GT of the amplification transistor 114G via a metal connection conductor 227, which are entirely the charge holding unit 112G. Additionally, the connection conductor 227 is covered with an insulative film 228 such as SiO2 or SiN to be insulated in the P-type semiconductor substrate 21.

Further, the transfer transistor 191B for Blue light is configured of a gate part 191BGT on the P-type semiconductor substrate 21 as well as the n-type semiconductor region 204 and an n-type diffusion layer 231 in the P-type semiconductor substrate 21, and the transfer transistor 191R for Red light is configured of a gate part 191RGT on the P-type semiconductor substrate 21 as well as the n-type semiconductor region 205 and the n-type diffusion layer 231 in the P-type semiconductor substrate 21.

Further, the reset transistor 113RB is configured of a gate part 113RBGT on the P-type semiconductor substrate 21, and n-type diffusion layers 234 and 235 in the P-type semiconductor substrate 21, and the amplification transistor 114RB is configured of a gate part 114RBGT on the P-type semiconductor substrate 21, and n-type diffusion layers 235 and 236 in the P-type semiconductor substrate 21. The n-type diffusion layer 235 is applied with the power supply voltage VDD, and is shared by the reset transistor 113RB and the amplification transistor 114RB.

Further, the select transistor 115RB is configured of a gate part 115RBGT on the P-type semiconductor substrate 21, and n-type diffusion layers 236 and 225 in the P-type semiconductor substrate 21. The n-type diffusion layer 225 is shared by the select transistor 115G and the select transistor 115RB.

The capacitance switching transistor 161RB is configured of a gate part 161RBGT on the P-type semiconductor substrate 21, and n-type diffusion layers 233 and 234 in the P-type semiconductor substrate 21, and the additional capacitance device 162RB configured in a MOS capacitor is configured of a gate part 162RBGT on the P-type semiconductor substrate 21, and an n-type diffusion layer 232 in the P-type semiconductor substrate 21.

The gate part 162RBGT of the additional capacitance device 162RB in a MOS capacitor is connected to the n-type diffusion layer 234 of the capacitance switching transistor 161RB via a metal wiring 282 provided in the insulative layer 237, and the n-type diffusion layer 232 of the additional capacitance device 162RB is connected to the power supply voltage VDD.

The n-type diffusion layer 231 shared by the transfer transistor 191B for Blue light and the transfer transistor 191R for Red light is a FD unit, and is connected to both the n-type diffusion layer 233 at one end of the capacitance switching transistor 161RB and the gate part 114RBGT of the amplification transistor 114RB, which are entirely the charge holding unit 112RB.

The surface on which the pixel transistors are formed on the P-type semiconductor substrate 21 is covered with the insulative film 237.

Additionally, FIG. 22 illustrates that a plurality of n-type diffusion layers shared as sources or drains of the pixel transistors are connected via the metal wirings because of limitations of illustration, but the pixel may be formed of one n-type diffusion layer, of course.

With the structure of the pixel 51E according to the fifth embodiment, the pixel circuit 101G for Green light has the same configuration as the pixel 51D according to the fourth embodiment illustrated in FIG. 17, and thus effects similar to the fourth embodiment described above are obtained for the charge holding unit 112G for holding a Green light signal.

That is, the capacitance of the charge holding unit 112G connected to the photoelectric conversion unit 111G is controlled depending on the amount of signal chares, thereby controlling the voltage amplitude of the charge holding unit 112G. That is, in a case where a large amount of signal charges are present, the capacitance of the charge holding unit 112G is increased so that an increase in voltage of the charge holding unit 112G is restricted and a decrease in voltage applied to the photoelectric conversion unit 111G is restricted. Thereby, a reduction in photoelectric conversion efficiency of the photoelectric conversion unit 111G can be restricted.

Further, the capacitance switching transistor 161G as a switch is inserted between the additional capacitance device 162G and the charge holding unit 112G. Thereby, in a case where the charge holding unit 112G is used at low capacitance, a leak current occurring in the additional capacitance device 162G can be prevented from mixing into the charge holding unit 112G.

Thus, a deterioration in photoelectric conversion characteristic (photoelectric conversion efficiency) can be restricted, and a deterioration in image quality of the solid-state image sensing device can be restricted.

Further, as described with reference to FIG. 12, the reset transistor 13 is controlled to be on always on low capacitance selected, and thus a variation in potential of the charge holding unit 112G due to coupling, or a mixture of a leak current into the charge holding unit 112G can be restricted on low capacitance selected.

Further, as described with reference to FIG. 16, the charge holding unit 112G is reset at the same GND potential as the P-type semiconductor substrate 21, and the bottom of the gate part 161GT of the capacitance switching transistor 161G is used from a strongly-inverted state, thereby restricting broken linearity due to a variation in capacitance, and restricting a noise of the charge holding unit 112G at low illuminance.

Further, even if a leak current occurs in the n-type diffusion layer 271 of the additional capacitance device 162G, the leak current flows to GND, and thus a leak current in the charge holding unit 112G can be restricted when the capacitance is increased, and both an increase in dynamic range of the solid-state image sensing device and a restriction of noise can be achieved.

A deterioration in image quality of the solid-state image sensing device can be further restricted thanks to the above effects.

Further, with the structure of the pixel 51E according to the fifth embodiment, the charge holding unit 112RB for holding the signals of photoelectrically-converted Red lights and Blue lights is provided in addition to the charge holding unit 112G for Green light, and the capacitance of the charge holding unit 112RB can be controlled independently of the Green signal by use of the capacitance switching transistor 161RB and the additional capacitance device 162RB.

Thereby, the gains of R, G, and B can be controlled to be different depending on a color of a subject. For example, in a case where a green subject is shot, the capacitance value of the charge holding unit 112G for Green light is increased thereby to restrict the amplification rate of the Green signal, and in a case where the Red and Blue signals are read, the capacitance value of the charge holding unit 112RB for Red light and Blue light is decreased thereby to set the signal amplification rate to be high. Thereby, an improvement in the S/N ratio of a shooting signal can be realized while restricting a deterioration in sensitivity of the photoelectric conversion unit 111G for various subjects.

Additionally, the pixel structure illustrated in FIG. 22 is such that the photoelectric conversion unit (the photoelectric conversion unit 111G) for photoelectrically converting lights of one color is formed outside the P-type semiconductor substrate 21 and the photoelectric conversion units (the photodiodes PD1 and PD2 by two PN junctions) for photoelectrically converting lights of two colors are formed in the P-type semiconductor substrate 21.

However, there may be configured such that a photoelectric conversion unit for photoelectrically converting lights of two colors is formed outside the P-type semiconductor substrate 21 and a photoelectric conversion unit (photodiode PD by one PN junction) for photoelectrically converting lights of one color is formed in the P-type semiconductor substrate 21. In this case, the photoelectric conversion film 202 includes two layers of a photoelectric conversion film for photoelectrically converting a Green light and a photoelectric conversion film for photoelectrically converting a Blue light, for example. Alternatively, the structure in which the photoelectric conversion film 202 is sandwiched between the upper electrode 203A and the lower electrode 203B may be stacked.

7. Exemplary Schematic Configuration of Solid-State Image Sensing Device

Figure 23:
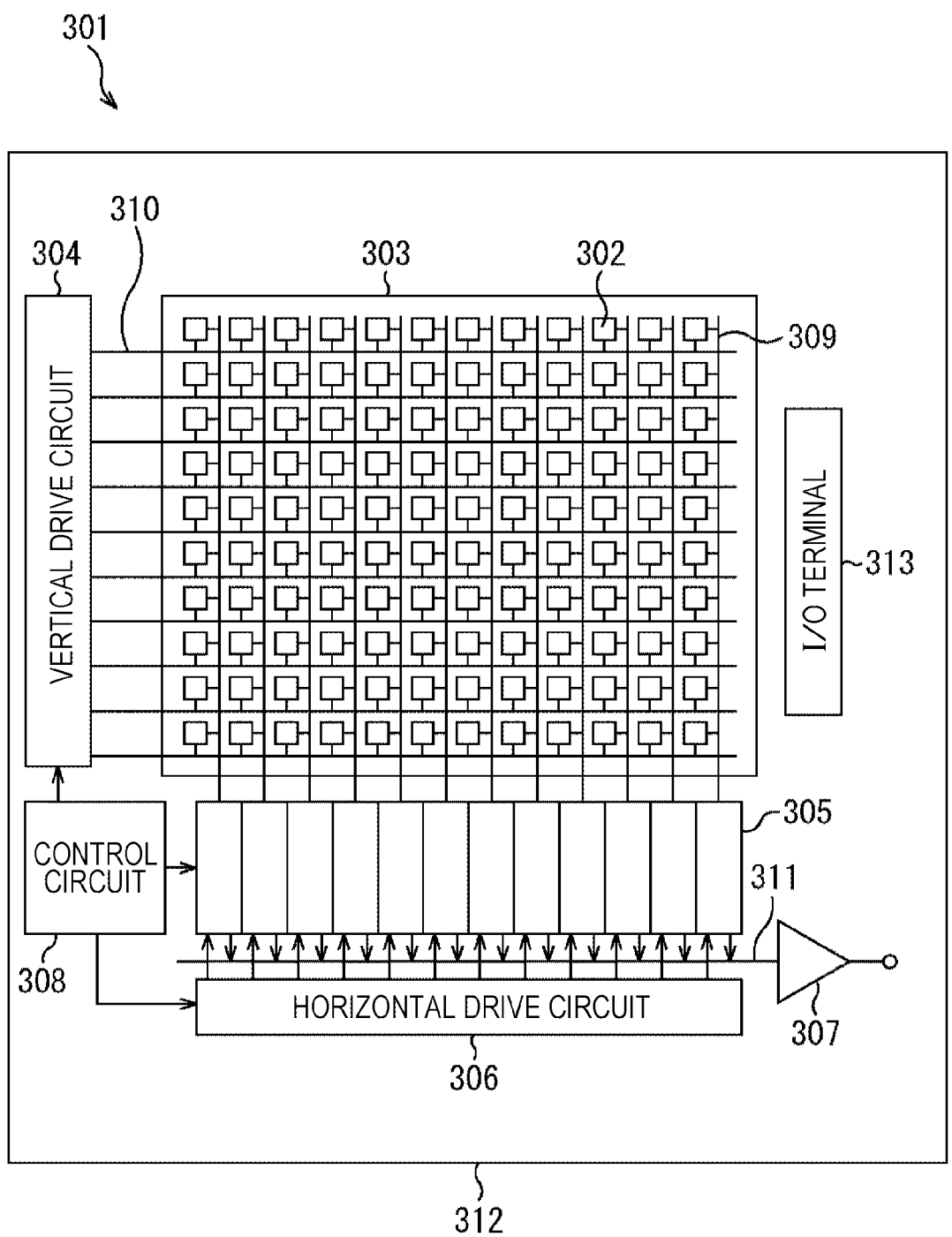
FIG. 23 is a diagram illustrating a schematic configuration of a solid-state image sensing device to which the present technology is applied.

The pixel 51A to the pixel 51E described above may be employed for pixels of a solid-state image sensing device illustrated in FIG. 23. That is, FIG. 23 is a diagram illustrating a schematic configuration of a solid-state image sensing device to which the present technology is applied.

A solid-state image sensing device 301 in FIG. 23 is configured such that a pixel array part 303 in which pixels 302 are two-dimensionally arranged in a matrix shape, and the surrounding circuit units around the same are provided on a semiconductor substrate 312 using silicon (Si) as semiconductor, for example. The surrounding circuit units include a vertical drive circuit 304, column signal processing circuits 305, a horizontal drive circuit 306, an output circuit 307, a control circuit 308, and the like.

The configuration of any of the pixel 51A to the pixel 51E described above is employed for the pixels 302.

The control circuit 308 receives an input clock and data for instructing an operation mode or the like, and outputs data such as internal information of the solid-state image sensing device 301. That is, the control circuit 308 generates a clock signal or control signal which is a reference of the operations of the vertical drive circuit 304, the column signal processing circuits 305, and the horizontal drive circuit 306 on the basis of a vertical synchronization signal, a horizontal synchronization signal, and a master clock. The control circuit 308 then outputs the generated clock signal or control signal to the vertical drive circuit 304, the column signal processing circuits 305, the horizontal drive circuit 306, and the like.

The vertical drive circuit 304 is configured of a shift register, for example, selects a predetermined pixel drive wiring 310, supplies the selected pixel drive wiring 310 with a pulse for driving the pixels 302, and drives the pixels 302 in units of row. That is, the vertical drive circuit 304 selects and scans the pixels 302 in the pixel array part 303 in units of row sequentially in the vertical direction, and supplies a column signal processing circuit 305 with a pixel signal based on the signal charges generated depending on the amount of received lights in the photoelectric conversion unit in each pixel 302 via a vertical signal line 309.

The reset signals RST, RST(G), and RST(RB), the select signals SEL, SEL(B), and SEL(RB), the switching control signals CapSEL, CapSEL(G), and CapSEL(RB), the transfer signals TG(R) and TG(B), and the like, which are described above, are controlled by the vertical drive circuit 304 via the pixel drive wirings 310.

Each of the column signal processing circuits 305 is arranged per column of the pixels 302, for example, and performs a signal processing such as noise cancellation on a signal output from one row of pixels 302 per column of pixels. For example, the column signal processing circuits 305 perform the signal processings such as CDS or AD conversion for canceling a pixel-specific fixed pattern noise.

The horizontal drive circuit 306 is configured of a shift register, for example, sequentially outputs a horizontal scan pulse, selects each of the column signal processing circuits 305 in turn, and outputs a pixel signal from each of the column signal processing circuits 305 to a horizontal signal line 311.

The output circuit 307 performs a signal processing on a signal sequentially supplied from each of the column signal processing circuits 305 via the horizontal signal line 311, and outputs the processed signal. The output circuit 307 may perform only buffering, or may perform black level adjustment, column variation correction, various digital signal processings, and the like, for example. An I/O terminal 313 exchanges signals with the outside.

The solid-state image sensing device 301 configured as described above is a CMOS image sensor of a column AD system in which the column signal processing circuits 5 for performing a CDS processing and an AD conversion processing are arranged per column of pixels.

The configuration of any of the pixel 51A to the pixel 51E is employed for the pixels 302 in the solid-state image sensing device 301, and thus the solid-state image sensing device 301 can restrict a deterioration in photoelectric conversion characteristic (photoelectric conversion efficiency), and can restrict a deterioration in image quality of the solid-state image sensing device.

8. Exemplary Applications to Electronic Devices

The present technology is not limited to applications to solid-state image sensing devices. That is, the present technology is applicable to all the electronic devices using a solid-state image sensing device for an image acquisition unit (photoelectric conversion unit) including shooting devices such as digital still camera or video camera, portable terminal devices with a shooting function, and copying machines using a solid-state image sensing device for an image reading unit. A solid-state image sensing device may be formed as one-chip, or may be in a module form having a shooting function in which a shooting unit and a signal processing unit or an optical system are collectively packaged.

Figure 24:
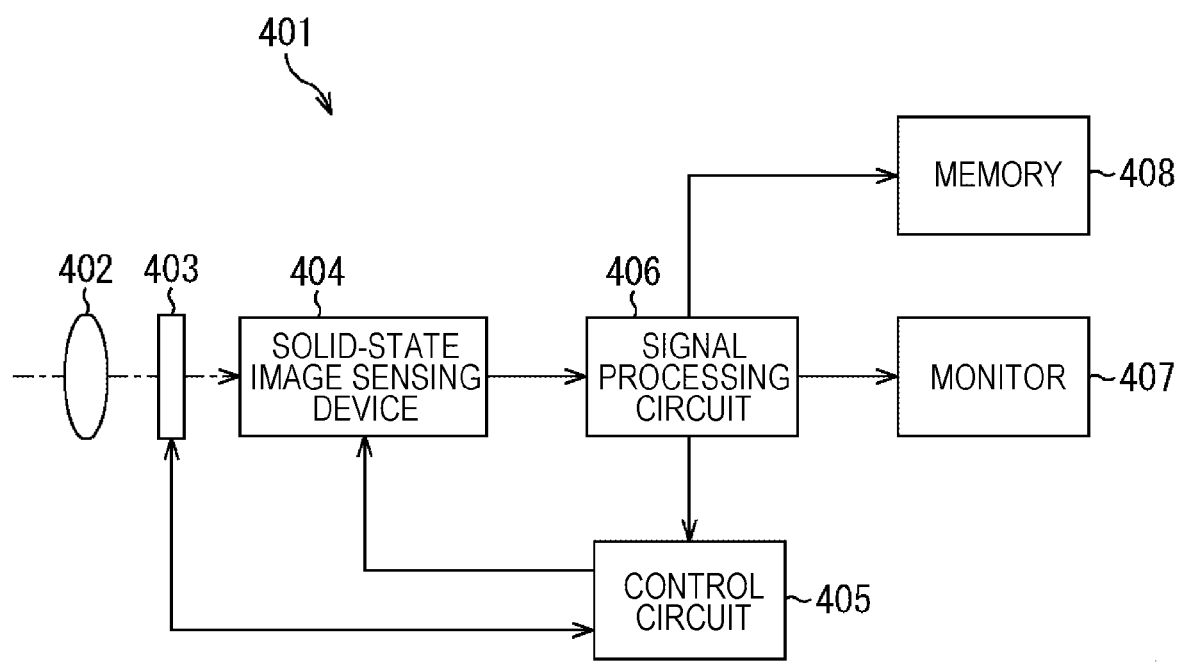
FIG. 24 is a block diagram illustrating an exemplary configuration of a shooting device as an electronic device to which the present technology is applied.

FIG. 24 is a block diagram illustrating an exemplary configuration of a shooting device as an electronic device to which the present technology is applied.

A shooting device 401 illustrated in FIG. 24 includes an optical system 402, a shutter device 403, a solid-state image sensing device 404, the control circuit 405, the signal processing circuit 406, a monitor 407, and a memory 408, and is capable of shooting still images and animations.

The optical system 402 is configured of one or more lenses, guides a light (incident light) from a subject to the solid-state image sensing device 404, and forms an image on a light receiving surface of the solid-state image sensing device 404.

The shutter device 403 is arranged between the optical system 402 and the solid-state image sensing device 404, and controls a light irradiation period and a light blocking period for the solid-state image sensing device 404 under control of the control circuit 405.

The solid-state image sensing device 404 is configured of the above-described solid-state image sensing device 301, or a solid-state image sensing device in which a deterioration in photoelectric conversion characteristic is restricted and a deterioration in image quality is restricted. The solid-state image sensing device 404 accumulates signal charges for a certain period of time depending on a light image-formed on the light receiving surface via the optical system 402 and the shutter device 403. The signal charges accumulated in the solid-state image sensing device 404 are transferred in response to a drive signal (timing signal) supplied from the control circuit 405. The solid-state image sensing device 404 may be configured as single one-chip, and may be configured as part of a camera module packaged together with the optical system 402 or the signal processing circuit 406.

The control circuit 405 is configured of a central processing unit (CPU) or the like, for example, and outputs a drive signal for controlling a transfer operation of the solid-state image sensing device 404 and a shutter operation of the shutter device 403 thereby to drive the solid-state image sensing device 404 and the shutter device 403.

A user (operator) makes an instruction from an operation unit (not illustrated) so that the shooting device 401 can select an operation at the high capacitance setting or the low capacitance setting. The control circuit 405 instructs the solid-state image sensing device 404 to take the high capacitance setting or the low capacitance setting on the basis of the user-designated setting information.

Further, the control circuit 405 can acquire the brightness of a subject in a shot image from the signal processing circuit 406, can (automatically) select the high capacitance setting or the low capacitance setting for shooting a next frame, and can instruct the solid-state image sensing device 404. The solid-state image sensing device 404 controls the capacitance switching transistor 61, 161G, or 161RB of each pixel 302 (pixel 51) on the basis of an instruction from the control circuit 405.

The signal processing circuit 406 is configured of a digital signal processor (DSP) or the like, for example, and performs various signal processings on a pixel signal output from the solid-state image sensing device 404. An image (image data) obtained by the signal processing circuit 406 performing a signal processing is supplied and displayed on the monitor 407, or supplied and stored (recorded) in the memory 408.

As described above, the solid-state image sensing device 404 employs a solid-state image sensing device with the structure of a pixel 51 according to each embodiment described above, thereby restricting a deterioration in photoelectric conversion characteristic and restricting a deterioration in image quality. Therefore, higher image quality of shot images can be achieved also in the shooting device 401 such as video camera, digital still camera, or camera module for mobile devices such as cell phones.

Embodiments of the present technology are not limited to the above-described embodiments, and can be variously changed without departing from the scope of the present technology.

For example, each semiconductor region of P-type or N-type on a semiconductor substrate may be configured of a semiconductor region of a reverse conductive type, respectively.

Further, the present technology is not limited to solid-state image sensing devices for detecting a distribution of the amounts of incident visible lights and shooting it as an image, and is applicable to all the solid-state image sensing devices (physical amount distribution detection devices) such as solid-state image sensing devices for shooting a distribution of the amounts of incident infrared rays, X-rays, or particles as an image, or fingerprint detection sensors for detecting a distribution of other physical amounts such as pressure or electrostatic capacitance in a broad sense and shooting it as an image.

A form in combination of all or some of the embodiments described above may be employed. For example, the pixel circuit 101G for Green light according to the fifth embodiment described above has the same configuration as the pixel 51D according to the fourth embodiment illustrated in FIG. 17, but instead may employ the configuration of any of the pixels 51A to 51C according to the first to third embodiments.

Further, the present technology is not limited to solid-state image sensing devices, and is applicable to all the semiconductor devices with other semiconductor integrated circuit.

Additionally, the effects described in the specification are merely exemplary and are not limited, and effects other than the effects described in the specification may be obtained.

Additionally, the present technology can employ the following configurations.

(1)

A solid-state image sensing device including:

a photoelectric conversion unit formed outside a semiconductor substrate;

a charge holding unit for holding signal charges generated by the photoelectric conversion unit;

a reset transistor for resetting the potential of the charge holding unit;

a capacitance switching transistor connected to the charge holding unit and directed for switching the capacitance of the charge holding unit; and an additional capacitance device connected to the capacitance switching transistor.

(2)

The solid-state image sensing device according to (1), in which the capacitance switching transistor is connected between the reset transistor and the charge holding unit.

(3)

The solid-state image sensing device according to (2), in which in a case where the capacitance of the charge holding unit is switched to a low capacitance by the capacitance switching transistor, the reset transistor is controlled to be always on.

(4)

The solid-state image sensing device according to (2), in which the reset transistor resets the potential of the charge holding unit at the same potential as the semiconductor substrate.

(5)

The solid-state image sensing device according to (4), in which the reset transistor resets the potential of the charge holding unit at GND.

(6)

The solid-state image sensing device according to any of (1) to (5), in which the additional capacitance device is configured of a MOS capacitor.

(7)

The solid-state image sensing device according to (6), in which a gate part of the MOS capacitor is connected to the charge holding unit.

(8)

The solid-state image sensing device according to (6), in which a diffusion layer of the MOS capacitor in the semiconductor substrate is connected to the charge holding unit.

(9)

The solid-state image sensing device according to any of (1) to (3), (6), and (8), in which the reset transistor resets the potential of the charge holding unit at a power supply voltage.

(10)

The solid-state image sensing device according to any of (1) to (9), in which the capacitance switching transistor and the reset transistor are connected in series.

(11)

The solid-state image sensing device according to (1), in which the capacitance switching transistor and the reset transistor are connected in parallel.

(12)

The solid-state image sensing device according to any of (1) to (11), in which the photoelectric conversion unit is configured such that a photoelectric conversion film is sandwiched by upper and lower electrodes.

(13)

The solid-state image sensing device according to any of (1) to (12), in which the pixel further has a different photoelectric conversion unit above or below the photoelectric conversion unit.

(14)

The solid-state image sensing device according to (13), in which the different photoelectric conversion unit is a photodiode formed on the semiconductor substrate.

(15)

The solid-state image sensing device according to (1), in which the signal charges generated by the photoelectric conversion unit are holes.

(16)

The solid-state image sensing device according to (1), in which the signal charges generated by the photoelectric conversion unit are electrons.

(17)

An electronic device including a solid-state image sensing device, the solid-state image sensing device including a pixel having:

a photoelectric conversion unit formed outside a semiconductor substrate;

a charge holding unit for holding signal charges generated by the photoelectric conversion unit;

a reset transistor for resetting the potential of the charge holding unit;

a capacitance switching transistor connected to the charge holding unit and directed for switching the capacitance of the charge holding unit; and an additional capacitance device connected to the capacitance switching transistor.

(18)

The electronic device according to (17), further including:

a control circuit for outputting a control signal for controlling the capacitance switching transistor.

(19)

The electronic device according to (18), in which the control circuit outputs a control signal for controlling the capacitance switching transistor on the basis of an image shot by the solid-state image sensing device.

(20)

The electronic device according to (18) or (19), in which the control circuit outputs a control signal for controlling the capacitance switching transistor on the basis of user-designated setting information.

REFERENCE SIGNS LIST

Photoelectric conversion unit
12 Charge holding unit
13 Reset transistor
21 P-type semiconductor substrate
28 Photoelectric conversion film
29A Upper electrode
29B Lower electrode
51 (51A to 51E) Pixel
61 Capacitance switching transistor
62 Additional capacitance device
101G, 101RB Pixel circuit
111B, 111G, 111R Photoelectric conversion unit
112G, 112RB Charge holding unit
113G, 113RB Reset transistor
161G, 161RB Capacitance switching transistor
162G, 162RB Additional capacitance device
301 Solid-state image sensing device
302 Pixel
401 Shooting device
404 Solid-state image sensing device
405 Control circuit
406 Signal processing circuit

The invention claimed is:

1. A solid-state image sensing device comprising:
   a photoelectric conversion unit formed outside a semiconductor substrate;
   a charge holding unit for holding signal charges generated by the photoelectric conversion unit;
   a reset transistor for resetting a potential of the charge holding unit;
   a capacitance switching transistor connected to the charge holding unit and directed for switching a capacitance of the charge holding unit;
   an additional capacitance device connected to the capacitance switching transistor; and
   a photodiode formed in the semiconductor substrate,
   wherein, in a plan view, the capacitance switching transistor overlaps the photodiode.

2. The solid-state image sensing device according to claim 1, wherein the capacitance switching transistor and the reset transistor are connected in series.

3. The solid-state image sensing device according to claim 1, wherein the reset transistor resets a potential of the charge holding unit at GND.

4. The solid-state image sensing device according to claim 1, wherein the additional capacitance device is configured of a MOS capacitor.

5. The solid-state image sensing device according to claim 1, wherein the photoelectric conversion unit is configured such that a photoelectric conversion film is sandwiched by upper and lower electrodes.

6. The solid-state image sensing device according to claim 1, wherein the signal charges generated by the photoelectric conversion unit are holes.

7. The solid-state image sensing device according to claim 1, further comprising an additional photodiode formed either below or above the photodiode in the semiconductor substrate, wherein in the plan view, the capacitance switching transistor overlaps the additional photodiode.

8. The solid-state image sensing device according to claim 7, wherein the photodiode and the additional photodiode share: a shared charge holding unit for holding signal charges generated by each of the photodiode and the additional photodiode, a shared reset transistor for resetting the potential of the shared charge holding unit, a shared capacitance switching transistor directed for switching the capacitance of the shared charge holding unit and a shared additional capacitance device.

9. The solid-state image sensing device according to claim 8, wherein a drain of the shared capacitance switching transistor is connected to a source of the shared reset transistor and to one end of the shared additional capacitance device.

10. The solid-state image sensing device according to claim 9, wherein a source of the shared capacitance switching transistor is connected to the shared charge holding unit and another end of the shared additional capacitance device is connected to a power source.

11. An electronic device comprising a solid-state image sensing device, the solid-state image sensing device comprising a pixel having:
   a photoelectric conversion unit formed outside a semiconductor substrate;
   a charge holding unit for holding signal charges generated by the photoelectric conversion unit;
   a reset transistor for resetting a potential of the charge holding unit;
   a capacitance switching transistor connected to the charge holding unit and directed for switching a capacitance of the charge holding unit;
   an additional capacitance device connected to the capacitance switching transistor; and
   a photodiode formed in the semiconductor substrate,
   wherein, in a plan view, the capacitance switching transistor overlaps the photodiode.

12. The electronic device according to claim 11, further comprising a control circuit for outputting a control signal for controlling the capacitance switching transistor.

13. The electronic device according to claim 12, wherein the control circuit outputs the control signal for controlling the capacitance switching transistor based on an image shot by the solid-state image sensing device.

14. The electronic device according to claim 12, wherein the control circuit outputs the control signal for controlling the capacitance switching transistor based on user-designated setting information.

15. The electronic device according to claim 11, wherein the photoelectric conversion unit is configured such that a photoelectric conversion film is sandwiched by upper and lower electrodes.

16. The electronic device according to claim 11, wherein the signal charges generated by the photoelectric conversion unit are holes.

17. The electronic device according to claim 11, further comprising an additional photodiode formed either below or above the photodiode in the semiconductor substrate, wherein in the plan view, the capacitance switching transistor overlaps the additional photodiode.

18. The electronic device according to claim 17, wherein the photodiode and the additional photodiode share: a shared charge holding unit for holding signal charges generated by each of the photodiode and the additional photodiode, a shared reset transistor for resetting the potential of the shared charge holding unit, a shared capacitance switching transistor directed for switching the capacitance of the shared charge holding unit and a shared additional capacitance device.

19. The electronic device according to claim 18, wherein a drain of the shared capacitance switching transistor is connected to a source of the shared reset transistor and to one end of the shared additional capacitance device.

20. The electronic device according to claim 19, wherein a source of the shared capacitance switching transistor is connected to the shared charge holding unit and another end of the shared additional capacitance device is connected to a power source.

* * * * *